United States Patent
Tobia et al.

(10) Patent No.: US 10,589,467 B2
(45) Date of Patent: Mar. 17, 2020

(54) SYSTEMS AND METHODS FOR CALIBRATION FEEDBACK FOR ADDITIVE MANUFACTURING

(71) Applicant: Desktop Metal, Inc., Burlington, MA (US)

(72) Inventors: Jay Tobia, Somerville, MA (US); Nihan Tuncer, Cambridge, MA (US); Aaron Preston, Arlington, MA (US); Ricardo Fulop, Lexington, MA (US); Michael A. Gibson, Carlisle, MA (US); Richard Remo Fontana, Cape Elizabeth, ME (US); Anastasios John Hart, Waban, MA (US)

(73) Assignee: Desktop Metal, Inc., Burlington, MA (US)

( * ) Notice: Subject to any disclaimer, the term of this patent is extended or adjusted under 35 U.S.C. 154(b) by 0 days.

(21) Appl. No.: 16/508,782

(22) Filed: Jul. 11, 2019

(65) Prior Publication Data

US 2019/0329500 A1    Oct. 31, 2019

Related U.S. Application Data

(63) Continuation of application No. 15/959,966, filed on Apr. 23, 2018.
(Continued)

(51) Int. Cl.
*B29C 64/393*    (2017.01)
*B29C 64/35*    (2017.01)
(Continued)

(52) U.S. Cl.
CPC ............ *B29C 64/393* (2017.08); *B22F 3/008* (2013.01); *B22F 3/1021* (2013.01);
(Continued)

(58) Field of Classification Search
CPC ..... B29C 64/393; B29C 64/35; B29C 64/188; G06F 17/5009; B33Y 10/00; B33Y 50/02;
(Continued)

(56) References Cited

U.S. PATENT DOCUMENTS

2006/0160250 A1*  7/2006  Bonassar ............... A61L 27/52
                                                            438/1
2013/0089642 A1*  4/2013  Lipson .................... A23P 20/20
                                                            426/115
(Continued)

OTHER PUBLICATIONS

Process Parameter Optimization of Extrusion-Based 3D Metal Printing Utilizing PW-LDPE-SA Binder System Luquan Ren, Xueli Zhou *, Zhengyi Song, Che Zhao, Qingping Liu *, Jingze Xue and Xiujuan Li Published: Mar. 16, 2017 (Year: 2017).*

(Continued)

*Primary Examiner* — Ziaul Karim
(74) *Attorney, Agent, or Firm* — Bookoff McAndrews, PLLC

(57) ABSTRACT

Complexity of a geometry of a desired (i.e., target) three-dimensional (3D) object being produced by an additive manufacturing system, as well as atypical behavior of the processes employed by such a system, pose challenges for producing a final version of the desired 3D object with fidelity relative to the desired object. An example embodiment enables such challenges to be overcome as a function of feedback to enable the final version to be produced with fidelity. The feedback may be at least one value that is associated with at least one characteristic of a printed object following processing of the printed object. Such feedback may be obtained as part of a calibration process of the 3D printing system or as part of an operational process of the 3D printing system.

26 Claims, 11 Drawing Sheets

Related U.S. Application Data

(60) Provisional application No. 62/489,186, filed on Apr. 24, 2017.

(51) Int. Cl.

| | |
|---|---|
| *B29C 64/188* | (2017.01) |
| *B33Y 50/02* | (2015.01) |
| *G06F 17/50* | (2006.01) |
| *B22F 3/10* | (2006.01) |
| *B22F 3/105* | (2006.01) |
| *B22F 3/00* | (2006.01) |
| *B33Y 10/00* | (2015.01) |

(52) U.S. Cl.
CPC .......... *B22F 3/1055* (2013.01); *B29C 64/188* (2017.08); *B29C 64/35* (2017.08); *B33Y 50/02* (2014.12); *G06F 17/5009* (2013.01); *B22F 2003/1057* (2013.01); *B22F 2203/03* (2013.01); *B22F 2301/00* (2013.01); *B33Y 10/00* (2014.12)

(58) Field of Classification Search
CPC .... B22F 2301/00; B22F 3/008; B22F 3/1021; B22F 3/1055; B22F 2203/03; B22F 2003/1057

See application file for complete search history.

(56) References Cited

U.S. PATENT DOCUMENTS

2017/0165921 A1* 6/2017 Fetter ..................... B33Y 10/00
2018/0224826 A1* 8/2018 Georgi ................ G05B 19/402

OTHER PUBLICATIONS

The metallurgy and processing science of metal additive manufacturing W. J. Sames,F. A. List,S. Pannala,R. R. Dehoff &S. S. Babu Published online: Mar. 7, 2016 (Year: 2016).*

Ren, L., et al., "Process Parameter Optimization of Extrusion-Based 3D Metal Printing Utilizing PW-LDPE-SA Binder System," Materials, 10(3):1-16 (Mar. 16, 2017).

Sames, W.J., et al., "The Metallurgy and Processing Science of Metal Additive Manufacturing," International Materials Reviews, 61(5):315-360 (Mar. 7, 2016).

International Search Report and Written Opinion, Issued in International Application No. PCT/US2018/028874, entitled 'Three-Dimensional (3D) Printing System Using Measured Processing Effects With Feedback to Processing Parameters, filed Apr. 23, 2018; dated Jul. 16, 2018; 17 pages.

* cited by examiner

SYSTEMS AND METHODS FOR CALIBRATION FEEDBACK FOR ADDITIVE MANUFACTURING

CROSS REFERENCE TO RELATED APPLICATIONS

This application is a continuation of U.S. patent application Ser. No. 15/959,966, filed Apr. 23, 2018, which is based on and claims the benefit of priority of U.S. Provisional Application No. 62/489,186, filed on Apr. 24, 2017, the content of each of which is incorporated by reference herein in its entirety.

BACKGROUND

Metal injection molding (MIM) is a metalworking process useful in creating a variety of metal objects. A mixture of a powdered metal material and a binder material (e.g., a polymer such as polypropylene) that may be a single binder or multiple binders and forms a "feedstock" (also referred to as a build material) capable of being molded, at a high temperature, into the shape of a desired object. The initial molded part, also referred to as a "green part," then undergoes a debinding process to remove the primary binder, followed by a sintering process. During sintering, the part is brought to a temperature near a melting point of the powdered metal material which evaporates any remaining binder material and forms the metal powder material into a solid mass, thereby producing the desired object.

Additive manufacturing, also referred to as three-dimensional (3D) printing, includes a variety of techniques for manufacturing a 3D object via an automated process of forming successive layers of the 3D object. An additive manufacturing system (also referred to as a 3D printing system) may utilize a feedstock comparable to that used in MIM, thereby creating the green part without the need for a mold. In the 3D printing system, the green part may then undergo debinding or sintering processes, or a combination thereof, to produce the desired object.

SUMMARY

According to an example embodiment, an additive manufacturing system may comprise a printing stage configured to print a three-dimensional (3D) object; a given processing stage configured to transform the 3D object into a processed object, the given processing stage being a debinding or a sintering stage that follows the printing stage or follows the printing stage and one or more of a plurality of processing stages; and a controller. The controller may be configured to identify a discrepancy between a characteristic of the processed object and an expected characteristic, the discrepancy identified based on a value associated with the characteristic, and may adjust a parameter based on the value. The parameter may be known to influence the characteristic and may be stored in a memory accessed by the system. The parameter, in an adjusted state, may be employed by the system to affect its operating state that, in turn, produces a subsequent processed object with a corresponding characteristic closer to the expected characteristic relative to the characteristic of the processed object, the subsequent processed object having been processed by the given processing stage.

The system may further comprise an obtaining device configured to obtain the value associated with the characteristic of the processed object.

The controller may be operatively coupled to the printing stage, the given processing stage, the plurality of processing stages, the obtaining device, or a combination thereof.

The printing stage, the given processing stage, the plurality of processing stages, or a combination thereof, may include the obtaining device.

The 3D object may be a calibration object for calibrating the system.

To obtain the value, the obtaining device may be configured to measure the processed object.

The obtaining device may include a contact or non-contact measuring device, or a combination thereof, to measure the processed object.

The value may be a measurement of a geometric characteristic.

The characteristic may be a dimension or geometric feature.

The characteristic may be a location or geometric attribute associated with a mark or feature printed on the 3D object for determining a processing effect based on measurements of the mark or the feature.

The subsequent processed object may be of a higher geometric accuracy than the processed object relative to a target geometry, the higher geometric accuracy based on a comparison of differences between the target geometry and respective geometries of the processed object and the subsequent processed object.

The characteristic may be mass and the value may be a mass value.

The subsequent processed object may be of a higher mass accuracy than the processed object relative to a target mass. The higher mass accuracy may be based on a comparison of differences between the target mass and respective masses of the processed object and the subsequent processed object.

The characteristic may be chemical composition and the value may be a concentration of a chemical constituent.

The subsequent processed object may be of a higher chemical composition accuracy than the processed object relative to a target chemical composition. The higher chemical composition accuracy may be based on a comparison of differences between the target chemical composition and respective chemical compositions of the processed object and the subsequent processed object.

The controller may be further configured to trigger at least one action as a function of the value and wherein, to trigger the at least one action, the controller may be further configured to: generate an alert to schedule maintenance of the system; or signal a malfunction of the system.

The controller may be further configured to communicate the alert or malfunction via an operator interface or transmission of an electronic message to an electronic device communicatively coupled to the system.

The alert generated or the malfunction signaled may be based on the value and an expected value.

The value may be a first value and the obtaining device may be further configured to obtain a second value associated with the characteristic of the 3D object prior to processing the 3D object at the given processing stage. The controller may be further configured to generate the alert or signal the malfunction based on the first value and the second value. The alert generated or the malfunction signaled may be based on the first value, the second value, and an expected value.

To obtain the second value, the obtaining device may be further configured to measure the 3D object prior to processing of the 3D object at the given processing stage.

The value may be a measured value.

The controller may be further configured to identify atypical deformation in the processed object based on the value and adjust the parameter, automatically, based on the atypical deformation identified in order to obviate the atypical deformation in the subsequent processed object.

The parameter may include at least one scaling factor associated with an x, y, or z axis direction. The at least one scaling factor may be employed by the system to offset shrinkage of the 3D object due to the given processing stage. The controller may be further configured to adjust the at least one scaling factor to offset shrinkage of the subsequent processed object in the x, y, or z axis direction.

The controller may be further configured to adjust the parameter as a function of the first value, and second value, and an expected value.

The obtaining device may be further configured to obtain the second value by measuring the 3D object prior to processing of the 3D object at the given processing stage. The obtaining device may be a contact or non-contact measuring device, or a combination thereof, and the obtaining device may be further configured to obtain the second value from (i) a 3D object model employed by the printing stage, (ii) the 3D object prior to processing of the 3D object at the given processing stage, (iii) the processed object, or (iv) a combination thereof.

The controller may be further configured to: determine a difference between the first value and the second value; adjust the parameter based on the difference determined; compare the difference determined to an expected value; and adjust the parameter based on the comparison, wherein the difference may be determined by computing a ratio of the first value and second value or computing the difference via subtraction.

The parameter may include at least one 3D fabrication parameter employed by the printing stage. The controller may be further configured to adjust the at least one 3D fabrication parameter to cause dilation, contraction, warping, or a combination thereof, of a corresponding characteristic of the subsequent processed object relative to the characteristic of the processed object.

The parameter may be an extrusion profile parameter employed by the printing stage and the controller may be further configured to adjust the extrusion profile parameter.

The parameter may include at least one temperature value employed by the given processing stage and the controller may be further configured to adjust the at least one temperature value employed.

The parameter may include at least one furnace parameter or furnace cycle parameter that is applied by the controller to control a furnace employed by the given processing stage. The controller may be further configured to adjust the at least one furnace or furnace cycling parameter to compensate for a specification of the furnace determined to be out of range via the value obtained.

Alternative method embodiments parallel those described above in connection with the example system embodiment.

According to yet another example embodiment, a system may comprise means for processing a three-dimensional (3D) object at a given processing stage that follows printing or follows a combination of printing and processing of the 3D object in a 3D printing system to transform the 3D object into a processed object. The processing may include debinding or sintering of the 3D object. The system may comprise means for identifying a discrepancy between a characteristic of the processed object and an expected characteristic, the discrepancy identified based on a value associated with the characteristic. The system may comprise means for adjusting a parameter based on the value, the parameter known to influence the characteristic and stored in a memory accessed by the 3D printing system. The parameter, in an adjusted state, may be employed by the 3D printing system to affect its operating state that, in turn, produces a subsequent processed object with a corresponding characteristic closer to the expected characteristic relative to the characteristic of the processed object, the subsequent processed object having been processed by the given processing stage.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
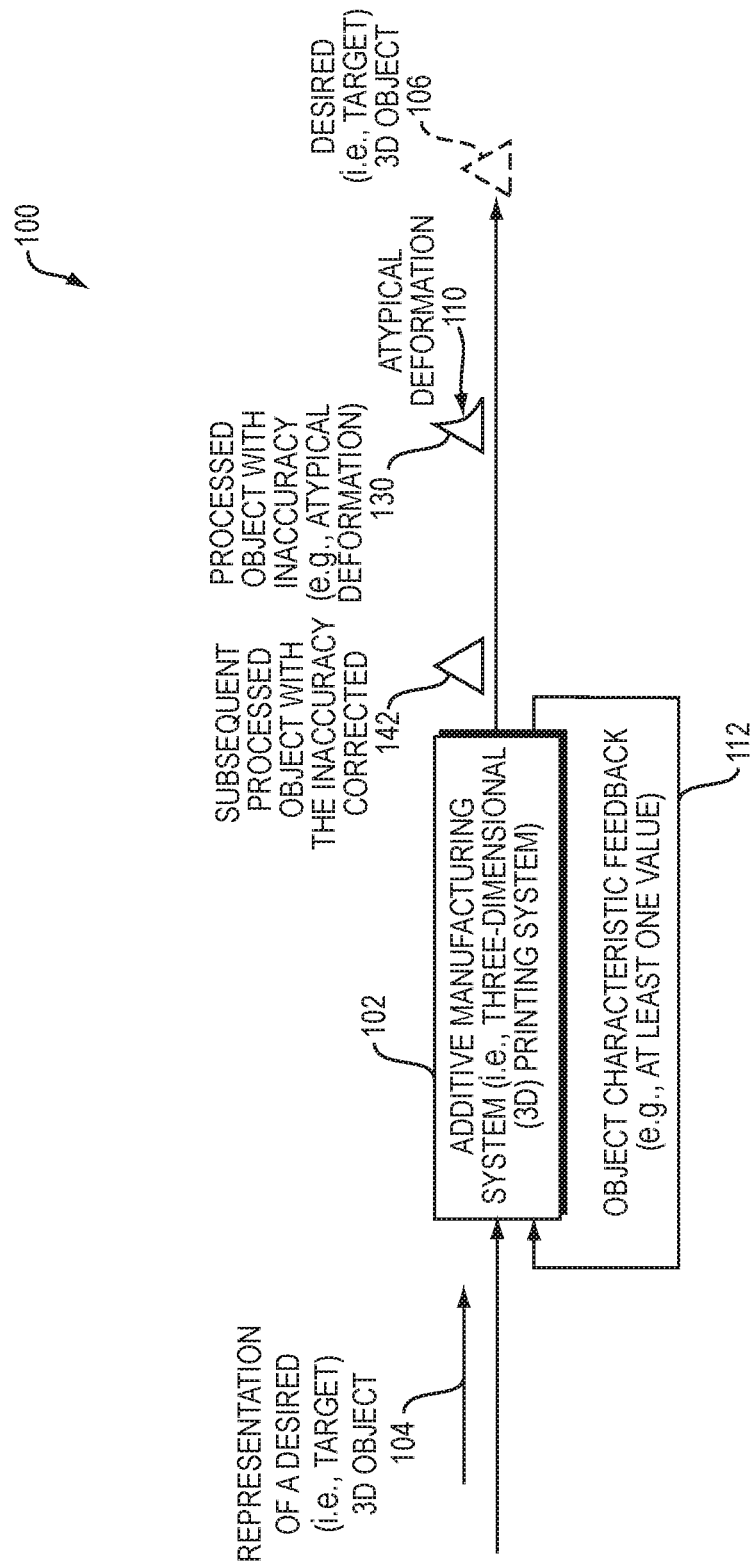
FIG. 1 is a block diagram of an example embodiment of an additive manufacturing system.

Complexity of a geometry of a desired (i.e., target) three-dimensional (3D) object being produced by an additive manufacturing system (referred to interchangeably herein as a 3D printing system), as well as atypical behavior of processes employed by such a system, pose challenges for producing a final version of the 3D object with fidelity relative to the desired 3D object. An example embodiment overcomes such challenges by employing feedback to enable the final version to be produced with fidelity. The feedback may be referred to interchangeably herein as object characteristic feedback and may be associated with at least one characteristic of a printed object following processing of the printed object. A 3D object may be referred to interchangeably herein as a 3D printed object or simply, the printed object. Processing of the printed object, such as a de-powdering, debinding, or sintering, or a combination thereof, or any other suitable processing operation that enables the printed 3D object to be produced in a final form may be referred to interchangeably herein as post-processing or simply, processing.

According to an example embodiment, the feedback may be at least one value that is associated with at least one characteristic of a printed object following processing of the printed object. According to an example embodiment, such feedback may be obtained as part of a calibration process of the 3D printing system or as part of an operational process of the 3D printing system. Further, such feedback may enable closed-loop calibration or run-time operation of the 3D printing system in which the 3D printing system may operate in a continuous manner fabricating 3D objects and improving such fabricated 3D objects on an object-by-object basis.

According to an example embodiment, an additive manufacturing system or method therefore may process a 3D object at a given processing stage of a plurality of processing stages of a three-dimensional (3D) printing system to produce a processed object. The 3D object input to the given processing stage may be a processed or a unprocessed version of the 3D object that is printed by a printing stage. The processed version may have been processed at one or more of a plurality of processing stages following the printing stage. The given processing stage may be a debinding stage or a sintering stage. At least one value associated with at least one characteristic of the processed object may be obtained. At least one action may be triggered as a function of the at least one value obtained. The at least one action may be triggered to improve the at least one characteristic in a subsequent processed object, the subsequent processed object having been processed by the given processing stage.

An example embodiment disclosed herein may improve a three-dimensional (3D) printing system as a function of feedback, wherein the feedback may be at least one value that may be associated with at least one characteristic of a printed object following processing of the printed object. Such feedback may be obtained as part of a calibration process of the 3D printing system or as part of an operational process of the 3D printing system. Such a 3D printing system may comprise a printing stage and at least one processing stage.

The printing stage may be configured to print a 3D object, such as by extruding a build material onto a build platform (also referred to interchangeably herein as a bed or build plate), layer by layer, such as disclosed with reference to FIG. 6, disclosed further below, or by spreading a powder material across a top surface of a powder bed and applying a binder material to regions of the powder material, layer by layer, such as disclosed with reference to FIG. 10, disclosed further below, or by printing the 3D object via any other suitable manner. The at least one processing stage may be any suitable processing stage that performs a processing operation, such as a de-powdering, debinding, or sintering, or a combination thereof, or any other suitable processing operation that enables the printed 3D object to be produced in a final form.

An example embodiment enables the 3D printing system to correct for inaccuracies, such as dimensional or mass inaccuracies, or any other inaccuracies. An example embodiment may identify such inaccuracies via measuring at least one characteristic of the object during or after the processing stage, before or after one or more processing stages, or a combination thereof. Such measurement(s) may be used to identify a discrepancy between a characteristic of a processed object and an expected characteristic and cause a controller to adjust a parameter, automatically, that is known to influence the characteristic and may also be employed to alert a user of such inaccuracies, or malfunction(s) of the 3D printing system resulting in such inaccuracies. By identifying and resolving such inaccuracies, an example embodiment allows for more complex geometries of 3D objects and enables such 3D objects to be fabricated of larger scale and with fidelity.

FIG. 1 is a block diagram 100 of an example embodiment of an additive manufacturing system 102. In the example embodiment, the additive manufacturing system 102 is configured to receive a representation 104 of a desired (i.e., target) 3D object in order to fabricate the desired 3D object 106. The system 102 may produce a processed object 130 with inaccuracy, such as an atypical deformation 110, relative to the desired 3D object 106. The atypical deformation 110 may be any deviation from the desired object, for example, as disclosed in FIG. 1, the processed object 130 has an inaccurate angle relative to the desired 3D object 106. It should be understood that such a deformation and geometry of the 3D objects disclosed herein are for illustrative purposes and that the deformation and geometry of such 3D objects may be any deformation or geometry.

According to an example embodiment, such inaccuracy may be corrected, for example, via the object characteristic feedback 112, that may be employed to adjust the 3D printing system 102 in a manner that enables the 3D printing system 102 to produce a subsequent processed object 142 with the inaccuracy corrected. The object characteristic feedback 112 may include at least one measurement of an intermediate version (not shown) of the desired 3D object 106, the at least one measurement performed prior to or after at least one processing stage (not shown), or a combination thereof, or may include any other suitable feedback that may be employed to correct the 3D printing system 102 such that the subsequent processed object 142 is produced with the inaccuracy corrected.

Such inaccuracies may be a result of anisotropic gravitation or malfunction of the printing or processing stage(s), such as motion system (not shown) errors in a motion system used for printing the desired 3D object 106 or a leaky furnace (not shown), or any other type of malfunction. Such inaccuracies may include atypical warping after debinding or sintering, or any other distortion or any other inaccuracy, such as atypical swelling or shrinking of the build material (not shown). In some cases, an inaccuracy, such as warping, slumping, or any other inaccuracy, may be unexpected because it may be due to a particular geometry of the desired 3D object 106 or a type of build material employed for producing same.

Figure 2:
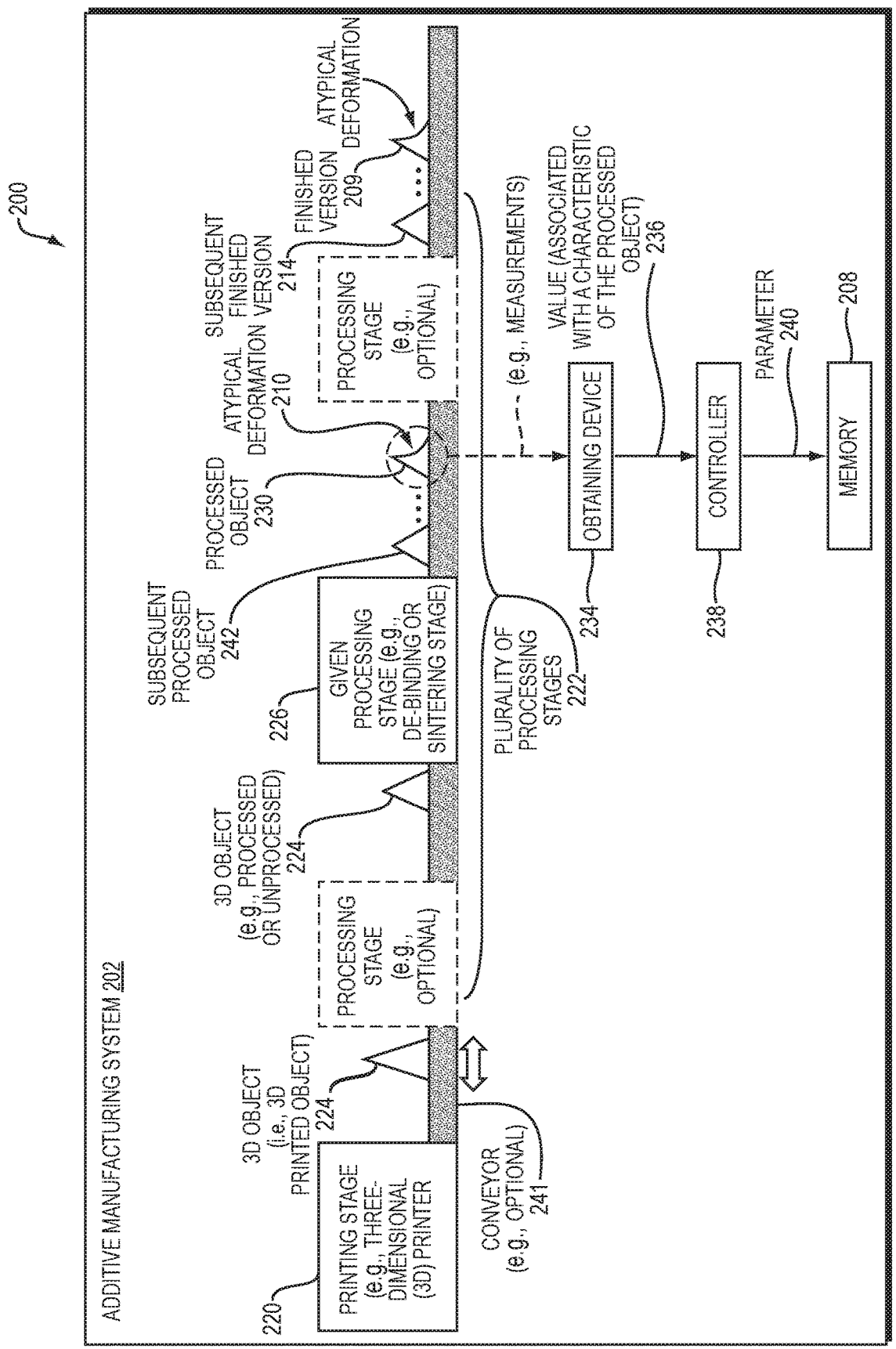
FIG. 2 is a block diagram of another example embodiment of an additive manufacturing system.

FIG. 2 is a block diagram 200 of another example embodiment of an additive manufacturing system 202. The additive manufacturing system comprises a printing stage 220 configured to print a three-dimensional (3D) object 224, a given processing stage 226 configured to transform the 3D object 224 (also referred to interchangeably herein as a 3D printed object) into a processed object 230, and a controller 238. The given processing stage 226 may be a debinding or a sintering stage that follows the printing stage 220 or follows the printing stage 220 and one or more of a plurality of processing stages 222. The controller 238 may be configured to identify a discrepancy, such as the atypical deformation 210 or any other suitable discrepancy between a characteristic of the processed object 230 and an expected (i.e., target) characteristic. The discrepancy may be identified based on a value 236 associated with the characteristic, and the controller 238 may adjust a parameter (not shown) based on the value 236. The parameter 240 may be known to influence the characteristic and may be stored in a memory 208 accessed by the system. The parameter, in an adjusted state, may be employed by the system 202 to affect its operating state that, in turn, produces a subsequent processed object 242 with a corresponding characteristic closer to the expected characteristic relative to the characteristic of the processed object 230, the subsequent processed object 242 having been processed by the given processing stage 226.

The parameter 240 may be referred to interchangeably herein as at least one parameter. The value 236 associated with the characteristic may be referred to interchangeably herein as at least one value. Further, the characteristic may be referred to interchangeably herein as the at least one characteristic.

The additive manufacturing system 202 may further comprise an obtaining device 234 that may be configured to obtain the at least one value 236 associated with at least one characteristic of the processed object 230. Prior to processing at the given processing stage 226, the 3D object 224 may be processed, optionally, at one or more of the plurality of processing stages 222. The controller 238 may be operatively coupled to the printing stage 220, the given processing stage 226, the plurality of processing stages 222, the obtaining device 234, or a combination thereof. The printing stage 220, the given processing stage 226, the plurality of processing stages 222, or a combination thereof, may include the obtaining device 234. The controller 238 may be configured to trigger at least one action as a function of the at least one value 236 obtained by the obtaining device 234. The at least one action may be triggered to improve the at least one characteristic in the subsequent processed object 242, the subsequent processed object 242 having been processed by the given processing stage 226.

The printing stage 220 may be performed by a 3D printer (not shown). The 3D printer may be a binder-jet printer system or any other suitable 3D printer system, such as a fused filament fabrication system, a stereolithography system, a selective laser sintering system, or any other system that can be usefully adapted to form a net shape object under computer control using injection molding build materials. The output of the printing stage 220 may be the 3D object 224 that is a 3D printed object that may be a green body including any suitable powder, such as a metal powder, metal alloy, or ceramic powder, along with a binder that retains the powder in the net shape produced by the printing stage 220.

The additive manufacturing system 202 may include, optionally, a conveyor 241 that may be used to transport the 3D object 224 from the printing stage 220 to a processing stage of the plurality of processing stages 222 where de-powdering, debinding, sintering, or a combination thereof may be performed according to a specific type of the 3D printing system. According to an example embodiment, no transport may be needed between printing and processing stages of the additive manufacturing system 202. Further, in an event transport is needed, such transport may be automatic, such as via the conveyor 241, or any other suitable transport mechanism.

According to an example embodiment, the conveyor 241 may be used to transport the 3D object from a processing stage back to the printing stage 220, for example, to perform a measurement or other analysis of the 3D object after printing the 3D object or after processing the 3D object at one or more processing stages. The conveyor 241 may be any suitable device or combination of devices suitable for physically transporting the 3D object. Such a conveyor 241 may include robotics (not shown) and a machine vision system (not shown) or the like on the printer side for detaching the 3D object from a build platform (not shown) or the like, as well as robotics and a machine vision system or the like on the processing side to accurately place the 3D object within the at least one processing stage (also referred to interchangeably herein as a station). Alternatively, the 3D object may be manually transported between the printing stage and a processing stage, such as a debinding or sintering stage. It should be understood that the processes of debinding may include a range of processes used to remove one or more binders from a fabricated 3D object. Further, the process of sintering may include any process used to form a bond between powder particles forming the fabricated 3D object.

Debinding may be performed chemically or thermally to remove a binder that retains the metal (or ceramic or other) powder in the net shape. Injection molding materials may be engineered for thermal debinding, which advantageously permits debinding and sintering to be performed in a single baking operation, or in two similar baking operations. In general, the debinding process functions to remove binder from the net shape green object, thus, leaving a very dense structure of metal (or ceramic or other) particles and a secondary binder. The secondary binder may be removed, for example, in the furnace (not shown) in a thermal debind process. Debinding can occur as a pure thermal debind—all polymer may be removed in the furnace, or it can occur in two steps in which one binder is removed, chemically, and then a second binder is removed, thermally.

Sintering may be any process of compacting and forming a solid mass of material by heating. Such sintering may employ a liquid phase sintering that may be used on materials, such as aluminum. During a sintering process, atoms can diffuse across particle boundaries to fuse into a solid piece. Because sintering can be performed at temperatures below the melting temperature, this advantageously permits fabrication with very high melting point materials, such as tungsten and molybdenum. Numerous sintering techniques are known in the art, and the selection of a particular technique may depend upon the build material used and the desired structural, functional, or aesthetic result for the fabricated object.

For example, in solid-state (non-activated) sintering, metal powder particles are heated to form connections (or "necks") where they are in contact. Over time, these necks thicken and create a dense part, leaving small, interstitial voids that can be closed, for example, by hot isotactic pressing (HIP) or similar processes. Other techniques may also or instead be employed. For example, solid state activated sintering uses a film between powder particles to improve mobility of atoms between particles and accelerate the formation and thickening of necks. As another example, liquid phase sintering may be used, in which a liquid forms around metal particles. This can improve diffusion and joining between particles, but may also leave a lower-melting phase within the sintered object that may impair structural integrity.

Processing stages, such as debinding and sintering stages may have a processing effect such as material loss and compaction, and a resulting object output from such a processing stage may be significantly smaller than an input object provided to such a processing stage. Such shrinkage may be generally linear in the aggregate, and net shape objects may be usefully scaled up when printing to create a corresponding shape after debinding and sintering that yields the desired (i.e., target) shape for the 3D object in final form. For example, a representation of the 3D object, such as a 3D model of the object, disclosed further below, may be scaled to account for such altering of shape by a processing stage. However, it may be that such altering of shape is atypical and does not match an expected alteration. For example, such shrinkage may be non-linear in the aggregate due to anisotropic shrinkage of the object which is a natural occurrence due to high temperature creep.

Since injection molding materials may be engineered for thermal debinding, it may be possible to perform multiple processing stages, such as debinding and sintering, within a single device. For example, the single device may be a sintering furnace. Commercial sintering furnaces for thermal de-bind and sintering of MIM parts may typically operate with an accuracy of +/−5 degrees Celsius or better, holding the material at a temperature below its melting point. It should be understood that any suitable device configured to de-bind or sinter, or configured to perform a combination thereof, may be employed to perform a processing stage of the plurality of processing stages 222. The thermal specifications or other specifications of such a processing stage may depend upon the particular powder material, binder material, loading, or other aspects of the 3D object being processed at the processing stage.

The 3D object 224, the processed object 230, and the subsequent processed object 242 may be 3D objects and may be referred to interchangeably herein as intermediate (i.e., green) 3D objects. It should be understood that such intermediate 3D objects may include a representation of the desired object as well as any other printed objects coupled thereto, such as the interface layer 356, base plate 352, and support structure(s) 354 disclosed further below with reference to FIG. 3, or fiducials and marks disclosed with reference to FIG. 4, further below.

As such, the 3D object 224 may be composed of a structure that represents geometry of the final part being constructed as well as any additional structures that may be removed later during the manufacturing process. For example, the 3D object 224 may include printed support structures that are printed for supporting aspects of such geometry to ensure fidelity of same during the manufacturing process. The 3D object 224 may include a printed substrate (also referred to interchangeably herein as a raft or base plate) that supports an entire mass of the structure that represents a geometry of the final part as well as any additional structures added and later removed during the manufacturing process. The 3D object 224 may include fiducials added to the printed structure or printed raft, or any other printed structure. As such, the 3D object 224 may be composed of the printed structure that represents the geometry of the final part as well as any other printed structures that are printed and coupled thereto.

A support structure may be used to provide structural support to a 3D object, such as the 3D object 346 of FIG. 3, disclosed below, that may be fabricated according to any one of the various different additive manufacturing techniques disclosed herein. For example, a support structure can be useful for providing structural support to the object as the 3D object undergoes processing, such as debinding and additionally, or alternatively, sintering. The 3D object and the support structure(s) may be fabricated according to any of the various different manufacturing processes disclosed herein and, for example, may be fabricated as part of the same additive manufacturing process.

An interface layer, also referred to interchangeably herein as an interface, can be applied between the 3D object and the support structure to facilitate, for example, removal of the support structure from the 3D object at an appropriate point in the formation of the 3D object into the final part. Such support structure(s) may be printed to obviate deformation, such as slumping of the 3D object. Since the 3D object may be weakened during sintering, for example, due to burning of a polymer resulting in voids, such support structure(s) may be printed to support the object in order to prevent deformation. However, it may be that such supports shrink non-uniformly or deform when bearing the load of supported structures and, thus, such support structures, as originally defined, for example, by a 3D model or other file(s) defining such support structures, may not be adequate. According to an example embodiment, such deformation may be identified via measurements and may be corrected, for example, by adjusting the definition(s) of such support structure(s) in the 3D model or other file(s) to correct for such deformation by adjusting the shape of the support structure(s).

Figure 3:
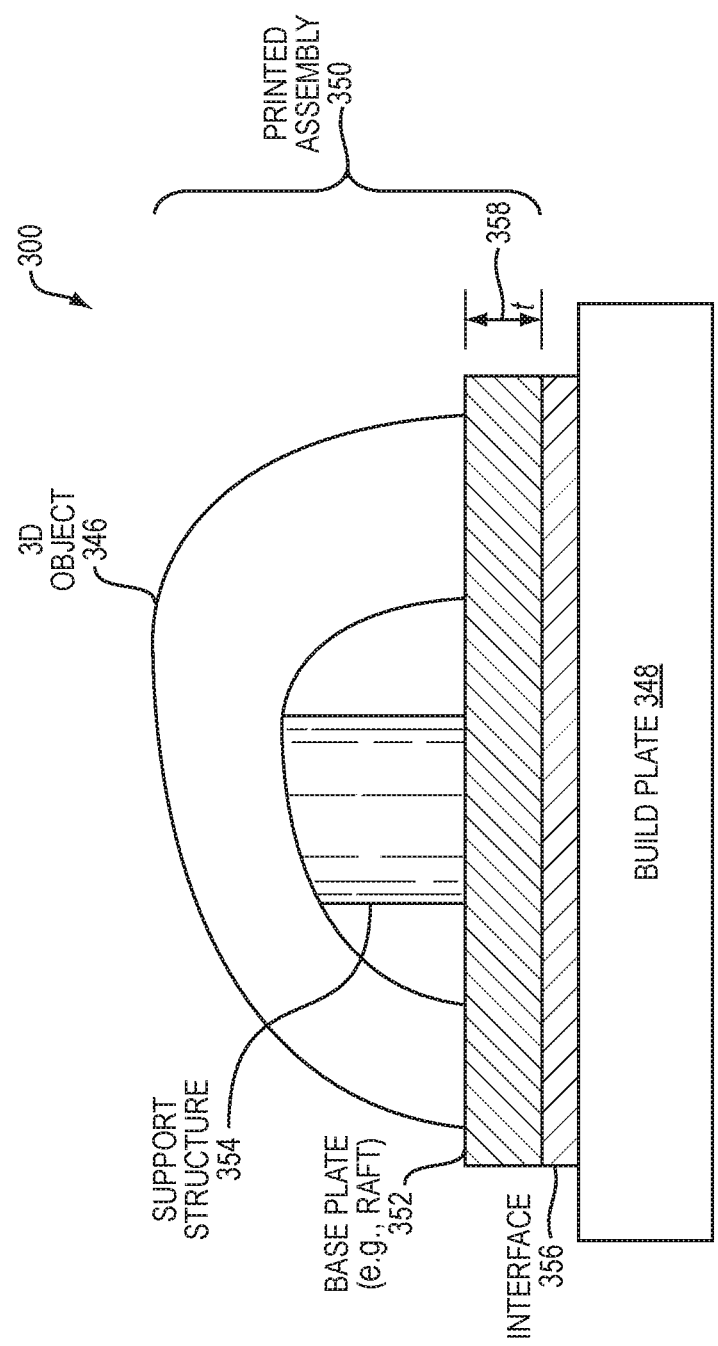
FIG. 3 is a block diagram of an example embodiment of a printed assembly.

FIG. 3 is a block diagram 300 of an example embodiment of a printed assembly 350. The printed assembly 350 includes a printed 3D object 346 with a shape corresponding to a desired shape of a desired object, and corresponding support structures residing atop a build plate 348 (e.g., a bed of a 3D printer) to support the shape of the printed 3D object 346 during processing. Such processing may be performed by removing the printed 3D object 346 from the build plate (i.e., build platform). Alternatively, the printed 3D object 346 may not be removed from the build platform for processing. For example, in a case of binder jet printing, the 3D object may remain in a powder bed (e.g., vat) that may be employed for both printing and processing stages.

Turning back to FIG. 3, the block diagram 300 of FIG. 3 is a lateral (i.e., cross-sectional) view of the printed assembly 350 and build plate 348. The printed assembly 350 may be fabricated and processed via one or more of the manufacturing processes as disclosed herein. The printed assembly 350 may be printed by a printing stage, such as the printing stage 220 of FIG. 2, disclosed above, that may be implemented by a 3D printer. Prior to or during printing, geometry of the printed assembly 350 may be defined by a 3D model, such as the 3D model 623 of FIG. 6, disclosed further below. Following printing, the printed assembly 350 (as a green part) may undergo further processing as disclosed above, including debinding and additionally, or alternatively, sintering, to produce a finished object that may be separated from the support structures of the printed assembly 350.

The support structures of the printed assembly 350 may include a base plate 352 (also referred to interchangeably herein as a raft or shrink raft) and a vertical support structure 354 that extends between a top surface of the base plate 352 and a bottom surface of a raised segment of the printed 3D object 346. An interface layer 356 may occupy a layer between the build plate 348 and the base plate 352. Alternatively, the interface layer 356 may not be employed. The interface layer 356 may include an interface material that is nonreactive relative to the material comprising the base plate 352, such as a powdered ceramic; thereby facilitating separation of the printed assembly 350 from the build plate 348 after the printing process is completed. Further, additional interface layers (not shown) may be formed between the 3D object 346 and the base plate 352, between the vertical support structure 354 and the printed 3D object 346, and/or between the vertical support structure 354 and the base plate

352. The interface layer 356 may be employed for sintering reasons, for example, to thermally isolate the part or reduce friction and bonding to a furnace floor. A polymer in the interface material of the interface layer 356 may chemically bond to the build plate 348 during printing, to allow adhesion during printing. After printing, the build plate 347 may be removed from the part and based plate 352. The part and the base plate 352 may then move through processing stages.

As such, the material compositions of the 3D printed object 346, the support structure(s) 354, and the interface layer 356 may facilitate providing structural support to the printed 3D object 346 through the physical and material property changes that occur during fabrication, debinding, and sintering, while facilitating removal of the support structure(s) 354 from the printed 3D object 346 with a reduced likelihood of damage and/or deformation to the final part.

As disclosed in the lateral view of FIG. 3, the base plate 352 has a thickness 358 indicated by t, and may be sufficient to support the mass of the 3D printed object 346 and the vertical support structure(s) 354 during the printing process, including the processing stages. The 3D model, such as the 3D model 623 disclosed with reference to FIG. 6 below, may be a representation of the 3D printed object 346 and may be modified to include the geometry of the base plate 352, as well as the vertical support structure(s) 354 and/or any interface layers, such as the interface layer 356, located between the components. With a complete 3D model of the printed assembly 350, a controller, such as the controller 238 of FIG. 2, may be configured to control the printing stage 220 to fabricate the printed assembly 350 that may represent the 3D object 224 of FIG. 2, disclosed above. Following printing, the 3D object 224 (i.e., green part) may undergo debinding and sintering processes as disclosed above to produce a finished object.

According to an example embodiment, the controller 238 may be operatively and/or communicatively coupled to the printing stage 220, the given processing stage 226, the plurality of processing stages 222, the obtaining device 234, or a combination thereof. The at least one value 236 associated with the at least one characteristic of the processed object 230 may be considered feedback, such as the object characteristic feedback 112 of FIG. 1, that may be employed by the controller 238 to identify a discrepancy between a characteristic of the processed object 230 and an expected characteristic and adjust a parameter known to influence the characteristic. The parameter, in an adjusted state, may be employed by the system 202 to affect its operating state that, in turn, produces the subsequent processed object 242 with a corresponding characteristic closer to the expected characteristic relative to the characteristic of the processed object 230, the subsequent processed object having been processed by the given processing stage 226. By improving the characteristic in the subsequent processed object 242, the additive manufacturing system 202 may produce a subsequent finished version 214 of the desired object with a higher fidelity relative to the desired object than a finished version 209.

According to an example embodiment, the controller 238 may aggregate or monitor the at least one characteristic that may be obtained at various location(s) along a chain of the plurality of processing stages 222 and may use such information to tweak or tune the printing stage 220, one or more processing stages of the plurality of processing stages 222, a 3D fabrication parameter employed to print the 3D object 224, or a combination thereof, by adjusting the parameter 240. According to an example embodiment, the controller 238 may collect the at least one characteristic obtained and forward the at least one characteristic along with information regarding settings of the additive manufacturing system 202 or the build material employed to produce the 3D object 224, or any other suitable information via a network (not shown) to a server (not shown). The server may determine new settings for the additive manufacturing system 202 translating to an adjustment of the parameter 240, which may be one or more parameters known to influence the characteristic, and such settings may define revisions for 3D fabrication parameter(s), such as disclosed, further below, or any other parameters employed by the additive manufacturing system 202 to alter operation of the additive manufacturing system 202 in a manner that results in higher fidelity 3D objects and, thus, improve the additive manufacturing system 202.

The subsequent processed object 242 may be of a higher geometric accuracy than the processed object 230 relative to a final target geometry. The higher geometric accuracy may be based on a comparison of differences between the target geometry and respective geometries of the processed object 230 and the subsequent processed object 242. The target geometry may be a final target geometry desired for a final version of the object or may be an intermediate geometry determined necessary for achieving such a final target geometry.

For example, the intermediate target geometry may be based on an expected processing effect, such as an amount of shrinkage expected due to the debinding or sintering stage, or any other suitable processing effect. The expected processing effect may be determined based on a specification(s) or setting(s) of the processing stage. The at least one value obtained 236 may be used to determine whether the processing effect differs from the expected processing effect. Such a difference may be due to atypical behavior of the processing stage that may result from, for example, a leaky furnace employed to perform sintering, or any other atypical behavior that results from a malfunctioning device employed for performing the processing stage.

Alternatively, or in combination with such atypical behavior that may result from a malfunctioning device, such a difference may result from complexity of geometry or other characteristic of the desired object. For example, an overhang 453 of the object 446 disclosed with reference to FIG. 4, disclosed below, may experience a higher degree of bending due to the processing than otherwise expected. It should be understood that an overhang is an example of complexity of a 3D object's geometry and that any other suitable complexity may result in such a difference. Further, bending is an example of a processing effect and it should be understood that any other suitable processing effect may result in such a difference.

According to an example embodiment, the printing stage 220, the given processing stage 226, and the plurality of processing stages 222, or a combination thereof, may include the obtaining device 234. The obtaining device 234 may be configured to obtain the at least one value 236 by measuring the processed object 230. According to an example embodiment, the obtaining device 234 may be a contact or non-contact measuring device, or a combination thereof. For example the obtaining device may be a coordinate measuring machine (CMM), 3D laser scanner, computer vision based system, optical based system, mass measuring device, chemical composition measuring device, caliper, micrometer, or any other suitable measuring device, or a combination thereof. According to an example embodiment, spectroscopy analysis may be used to measure chemical composition. The obtaining device 234 may be configured to perform the measuring, automatically, and communicate the at least one value 236 to the controller 238 via an electronic communication in response to the measuring.

According to an example embodiment, the obtaining device 234 may be manually operated by a user (not shown) to obtain the at least one value 236. The obtaining device 234, that may be manually operated, may be any of the above-disclosed obtaining devices, a set of calipers, or any other suitable measuring device that may be manually operated. According to an example embodiment, the user may operate the obtaining device 234, manually, and input feedback, such as the at least one value 236 obtained via the obtaining device 234, to the controller 238 via a user interface (not shown) or by communicating such feedback electronically via an electronic device (not shown) in communication with the controller 238, such a smart phone (not shown) or any other suitable electronic device.

The at least one value obtained 236 may be a measurement of a geometric characteristic. The measurement may represent any suitable measured size or geometry. For example, the at least one characteristic may include a dimension, geometric feature, such as curvature, angle, parallelism, or any other suitable geometric feature, positional tolerance or other tolerances, or a combination thereof. The at least one characteristic may include a location or geometric attribute associated with a mark or feature, such as the mark or features disclosed in FIG. 4 below, that may be placed on the 3D object 224 for determining a processing effect on the mark or the feature. The at least one value obtained 236 may enable such a determination.

Figure 4:
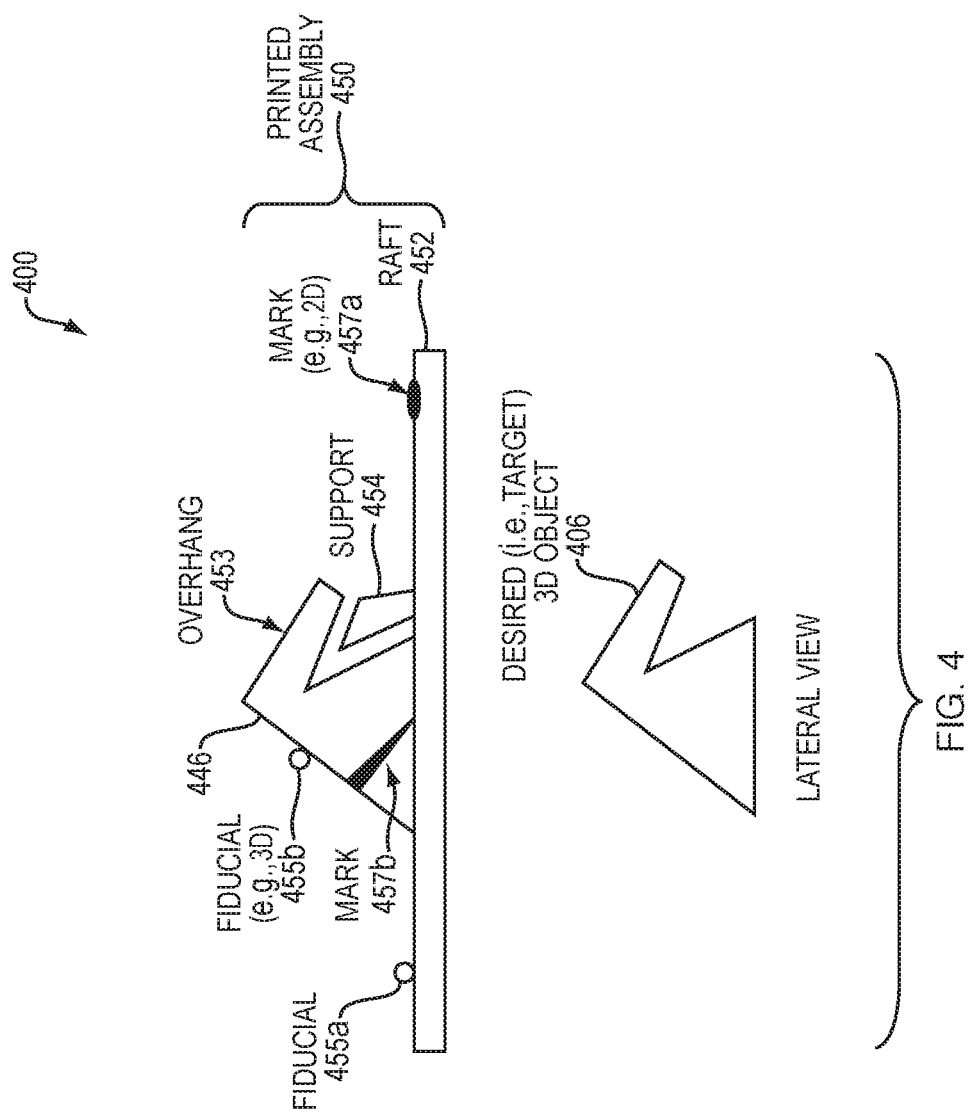
FIG. 4 is a block diagram of another example embodiment of a printed assembly.

FIG. 4 is a block diagram 400 of an example embodiment of a printed assembly 450. The printed assembly 450 (i.e., 3D printed assembly) may include an object 446, that is, a 3D printed object, with an overhang 453 supported by a support structure 454 and a raft 452 supporting the object 446 and the support structure 454 for the overhang 453. The printed assembly 450 may include a feature (e.g., fiducial), a mark, or a combination thereof applied thereto. For example, the printed assembly 450 may include the fiducial 455a and/or the mark 457a applied to the raft 452 and/or the object 446 may have the fiducial 455b and/or mark 457b applied thereto. Such fiducials and marks may be monitored by obtaining at least one value associated with a characteristic of such fiducials or marks at various points along the processing chain.

By monitoring or tracking such characteristics, adjustments may be made to the additive manufacturing system to improve fidelity of the desired object 406 being produced by the additive manufacturing system. According to an example embodiment, disclosed further below, the object 446 may be a calibration object or the entire printed assembly 450 may be the calibration object. As such, the object 446 may include the mark 457b or the fiducial 455b and/or the printed assembly 450 may include the mark 457a or the fiducial 455a that may be tracked as part of a calibration method for determining adjustments to settings of printing or processing stages, a 3D model representing the 3D object, or a combination thereof. It should be understood that the fiducials 455a and 455b and the marks 457a and 457b of FIG. 4 are for illustrative purposes and that any suitable fiducial or mark may be applied.

Turning back to FIG. 2, at least one characteristic may be mass and the at least one value 236 may be at least one mass value. The subsequent processed object 242 may be of a higher mass accuracy than the processed object 230 relative to a target mass. The higher mass accuracy may be based on a comparison of differences between the target mass and respective masses of the processed object 230 and the subsequent processed object 242. The target mass may be a final mass desired for a final version of the object or may be an intermediate mass expected after the printing stage 220 or a processing stage of the plurality of processing stages 222 for achieving the final mass.

In an event a measured mass of the processed object 230 differs from the target mass, such a mass difference may be resolved by adjusting a parameter of the printing stage 220 or the given processing stage 226. For example, the mass difference may be resolved in the subsequent processed object 242 by adjusting a printing parameter (not shown), such as an extrusion profile parameter (not shown), employed by the printing stage 220. Such an adjustment may obviate voids causing such a mass difference. The mass difference may be resolved in a subsequent processed object 242 by adjusting the parameter employed by the given processing stage 226.

For example, a chemical employed by a debinding stage or a debinding temperature thereof or schedule related thereto, may be changed to resolve the mass difference. Further any parameter of a sintering stage, such as a sintering temperature or schedule related thereto may be changed to resolve such a mass difference. It should be understood that a schedule for debinding or sintering may specify control for temperature over time and time for the intermediate object to be processed at the debinding or sintering stage, or may be any other suitable schedule for debinding or sintering. Changes to a sintering or debinding schedule may include changes to time, temperature, temperature heating rate, temperature cooling rate, or a combination thereof. It should be understood that any suitable action may be triggered as a function of the at least one value 236 and that such actions, such as a change to an extrusion profile parameter, change of chemical, change of temperature, such as elevation of a temperature debind, change in pressure in sintering, change in atmosphere in a furnace, are examples of such an action.

According to an example embodiment, the at least one characteristic may be chemical composition and the at least one value 236 may include a concentration of a chemical constituent. The subsequent processed object 242 may be of a higher chemical composition accuracy than the processed object 230 relative to a target chemical composition. The higher chemical composition accuracy may be based on a comparison of differences between the target chemical composition and respective chemical compositions of the processed object 230 and the subsequent processed object 242. According to an example embodiment, the concentration of the chemical constituent may be an amount of carbon or any other alloy element(s) that may be gained or lost during processing. The chemical composition difference may be resolved in the subsequent processed object 242 by adjusting the parameter employed by the given processing stage 226, such as by adjusting a debinding or sintering parameter.

The at least one action that is triggered may include generating an alert to schedule maintenance of the additive manufacturing system 202 or signaling a malfunction of the additive printing system 202. The alert generated or the malfunction signaled may be based on the at least one value and at least one expected value. The alert or malfunction may be communicated via an operator (i.e., user) interface (not shown) or via transmission of an electronic message (not shown) over a network (not shown) to an electronic device (not shown) that is communicatively coupled to the additive manufacturing system 202.

It should be understood that such a network may any suitable network enabling the electronic message to be communicated to the electronic device (local or remote), such as a wired or wireless network. The alert generated or the malfunction signaled may identify the printing stage 220, the given processing stage 226, the plurality of processing stages 222, or a combination thereof, any parameters, profile, or schedule related thereto, or any other suitable information, such as time of day information, 3D object information, build material information, information identifying the particular 3D object, being fabricated, a particular 3D model employed, or any other suitable information that may be useful for resolving the inaccuracy.

According to an example embodiment, the at least one value 236 may be at least one first value and the obtaining device 234 may obtain at least one second value associated with the at least one characteristic of the object prior to processing the 3D object 224 at the given processing stage 226. For example, the at least one value 236 may be obtained after printing the 3D object 224 and after sintering the 3D object 224. The alert generated or the malfunction signaled may be based on the at least one first value and the at least one second value. Alternatively, the alert generated or the malfunction signaled may be based on the at least one first value, the at least one second value, and at least one expected value. The obtaining device 234 may be configured to obtain the at least one second value by measuring the 3D object 224 prior processing the 3D object 224 at the given processing stage 226. It should be understood that the at least one first value may be obtained during printing of the 3D object 224. For example, in binder-jet printing, a measurement may be obtained as the 3D object 224 is being printed in the powder bed layer by layer.

The at least one action that is triggered may include adjusting at least one parameter employed by the additive manufacturing system 202. For example, the controller 238 may be configured to identify an atypical deformation 210 in the processed object 230 based on the at least one value 236 that is obtained and may adjust the at least one parameter based on the atypical deformation 210 that is identified in order to obviate the atypical deformation 210 from being produced in the subsequent processed object 242. For example, the atypical deformation 210 may be atypical slumping of the 3D object 224 that may be corrected by adjusting a 3D fabrication parameter for printing the 3D object 224.

According to an example embodiment, the at least one parameter may include at least one scaling factor associated with an x, y, or z axis direction. The at least one scaling factor may be a scaling factor(s) employed by the additive manufacturing system 202 to offset shrinkage of the 3D object 224 due to the given processing stage 226. The controller 238 may be configured to adjust the at least one scaling factor to offset shrinkage of the subsequent processed object 242 in the x, y, or z axis direction. As such, an inaccuracy of such shrinkage measured during fabrication of the finished version 209 may be obviated in the subsequent finished version 214. According to an example embodiment, shrinkage may be higher in the z-axis direction relative to the x or y-axis directions, for example, due to gravity, higher temperature creep, anisotropy of printed beads, or a combination thereof.

The at least one value 236 may be at least one first value and the obtaining device 234 may be configured to obtain at least one second value associated with the at least one characteristic of the object prior to processing of the 3D object 224 at the given processing stage 226. The controller 238 may be configured to adjust the parameter as a function of the at least one first value and the at least one second value. The controller 238 may be configured to adjust the parameter as a function of the at least one first value, the at least one second value, and at least one expected value. The obtaining device 234 may be configured to obtain the at least one second value by measuring the 3D object 224 prior to the processing of the 3D object 224 at the given processing stage 226.

The obtaining device 234 may be configured to obtain the at least one second value from a (i) 3D object model (not shown) employed by the printing stage 220, (ii) the 3D object 224, (iii) a processed version of the 3D object 224, or (iv) a combination thereof.

The controller 238 may be configured to adjust the at least one parameter by determining at least one difference between the at least one first value and the at least one second value and adjusting the at least one parameter based on the at least one difference determined. For example, the controller 238 may be configured to compare the at least one difference determined to at least one expected value and adjust the at least one parameter based on the comparison.

The at least one difference may be at least one ratio of the at least one first value and the at least one second value. For example, the at least one first value and the at least one second value may reflect measurements taken pre- and post—a particular processing stage and such a ratio may reflect shrinkage attributed to the particular processing stage or series of processing stages including the particular processing stage.

The at least one parameter may include at least one 3D fabrication parameter employed by the printing stage 220. The controller may be further configured to adjust the at least one 3D fabrication parameter to cause dilation, contraction, warping, or a combination thereof, of a corresponding characteristic of the subsequent processed object 242 relative to the characteristic of the processed object 230.

According to an example embodiment, adjusting the 3D fabrication parameter may alter a digital representation of the 3D object (i.e., 3D model), such as a stereolithography (STL) file. According to another example embodiment, adjusting the 3D fabrication parameter may alter slicing parameter(s) of the 3D object, such as slicer parameter(s) of a software slicing tool that cuts the digital representation into layers and generates toolpath commands based on same. According to yet another example embodiment, adjusting the 3D fabrication parameter may alter the toothpath command(s) themselves, such as by altering g-code commands generated by the software slicing tool. Further, adjusting the 3D fabrication may alter a combination of at least two of the digital representation of the 3D object, slicing parameter(s), and toolpath command(s).

Adjusting the 3D fabrication parameter may alter printing of the 3D object in any suitable way that affects a change to the subsequent processed object relative to the 3D object. According to an example embodiment, the 3D model may be scaled to account for atypical shrinkage of the 3D object and adjusting the 3D fabrication parameter may affect such scaling. Adjusting the 3D fabrication parameter may cause dilation, contraction, warping, or a combination thereof, of the digital representation of the 3D object, to affect such dilation, contraction, warping, or a combination thereof, of the subsequent processed object relative to the 3D object. Adjusting the 3D fabrication parameter may alter the digital representation of the 3D object to adjust for an inaccurate angle, slumping of the build material, non-uniform shrinkage of the 3D object, or to adjust for any other discrepancy identified. Adjusting the 3D fabrication parameter may change the digital representation of the 3D object that is used by a slicer to slice this digital representation into discrete layers to generate toolpath commands (e.g., flow rate, trajectory, temperature, etc.) for printing the 3D object or, alternatively, adjusting the 3D fabrication parameter may change such toolpath commands (X,Y,Z,E position vector commands) directly to affect a change in x-y-z scaling, an amount of material for extrusion, or a combination thereof. Adjusting the 3D fabrication parameter may also change slicing parameters including adding or modifying support structure(s), interface(s), or a raft for support, infill percentage, print speed, print temperature or heated chamber temperature, parameters that effect the extrusion profile (e.g., location, temperature, cooling rates, flow rate, etc.), etc.

The at least one parameter may be an extrusion profile parameter employed by the printing stage 220 and the controller 238 may be configured to adjust the extrusion profile parameter. For example, the controller 238 may be configured to adjust the extrusion profile parameter to obviate voids, such as disclosed above.

The at least one parameter may include any suitable setting that effects the printing of the 3D object, such as a chamber temperature setting, nozzle temperature setting, toolpath setting, etc.

The at least one parameter may include at least one temperature value employed by the given processing stage. The controller 238 may be configured to adjust the at least one temperature value employed. The at least one temperature value may be employed by the debinding stage to control a temperature of a solvent, or may be employed by the sintering stage, as disclosed above. The controller 238 may be configured to adjust an agitation of solvent, for example, by lowering agitation in response to parts warping in the debind process. As such, the at least one parameter may be at least one debinding process parameter or debinding process cycle parameter that is applied by the controller 238 to control a debinding process. Adjusting the at least one debinding process or debinding process cycling parameter may compensate for a specification of a debinding process determined to be out of range via the value 236 obtained.

Further, the at least one parameter may be at least one furnace parameter or furnace cycle parameter that is applied by the controller 238 to control a furnace, such as temperature, disclosed above, or any other suitable furnace or furnace cycle parameter. The furnace may be employed by the given processing stage 226 and the controller 238 may be configured to adjust the at least one furnace or furnace cycling parameter. Adjusting the at least one furnace or furnace cycling parameter may compensate for a specification of the furnace determined to be out of range via the value 236 obtained.

Figure 5:
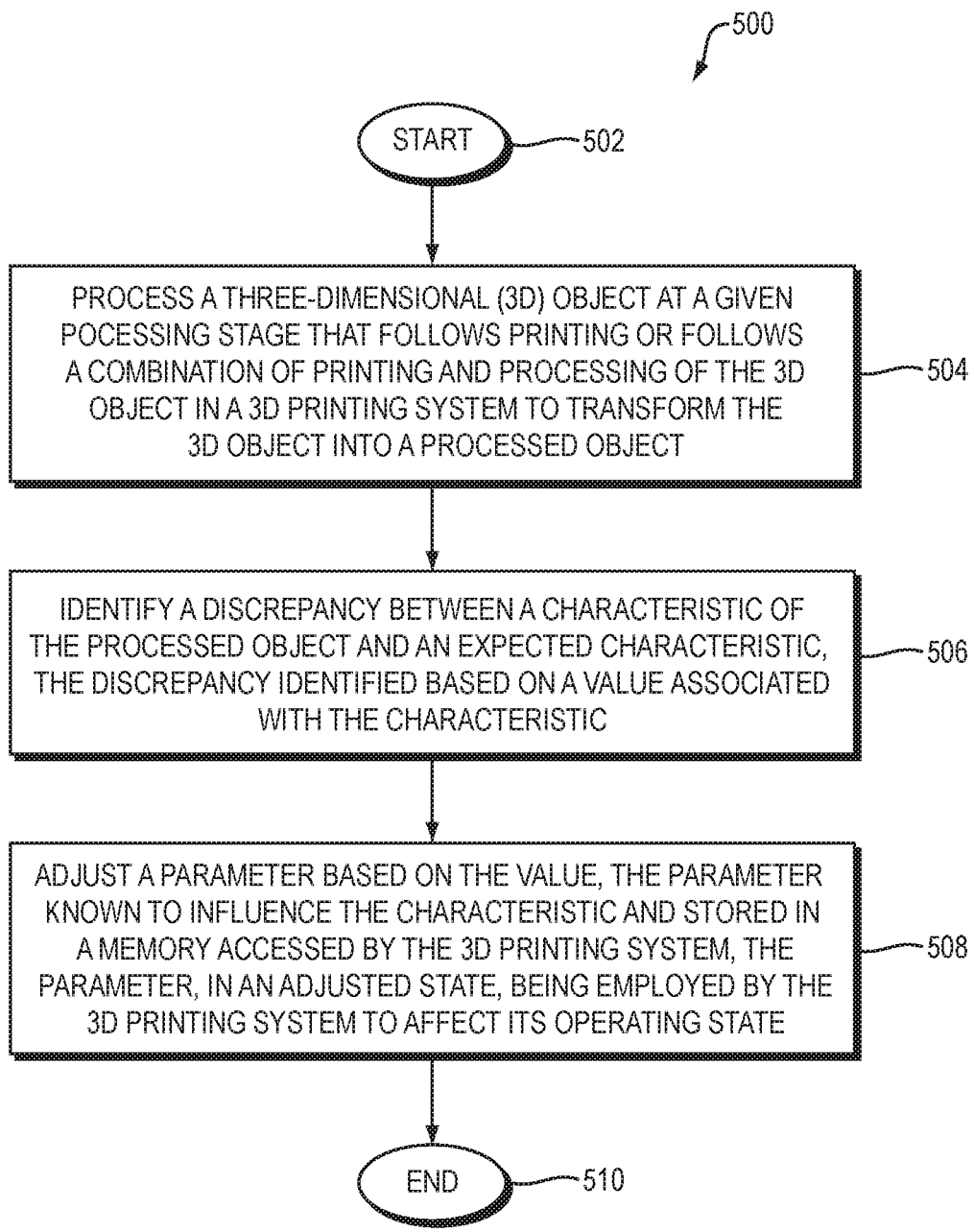
FIG. 5 is a flow diagram of an example embodiment of an additive manufacturing method.

FIG. 5 is a flow diagram of an example embodiment of an additive manufacturing method (500). The method begins (502) and processes a three-dimensional (3D) object at a given processing stage that follows printing or follows a combination of printing and processing of the 3D object in a 3D printing system to transform the 3D object into a processed object, the processing including debinding or sintering of the 3D object (504). The method identifies a discrepancy between a characteristic of the processed object and an expected characteristic, the discrepancy identified based on a value associated with the characteristic (506). The method adjusts a parameter based on the value, the parameter known to influence the characteristic and stored in a memory accessed by the 3D printing system, the parameter, in an adjusted state, being employed by the 3D printing system to affect its operating state that, in turn, produces a subsequent processed object with a corresponding characteristic closer to the expected characteristic relative to the characteristic of the processed object, the subsequent processed object having been processed by the given processing stage (508), and the method thereafter ends (510), in the example embodiment.

The method may comprise printing the object, iteratively, in successive layers and the processing, identifying, and adjusting may be performed during the printing.

Turning back to FIG. 2, according to an example embodiment, the 3D object 224 may be a calibration object for calibrating the 3D printing system, that is, the additive manufacturing system 202. As such, the processing, identifying, and adjusting operations may be performed as part of the calibrating. According to an example embodiment, the additive manufacturing system 202 may perform a closed loop calibration method that includes measuring a 3D object being produced by the system before and after various processing stages of the plurality of processing stages 222. The calibration method may employ such measurements in combination with expected measurements associated therewith to calibrate the additive manufacturing system 202 by adjusting at least one parameter employed by the additive manufacturing system 202. Adjustment of the at least one parameter may be based on a difference between such measurement and the expected measurement associated therewith. By adjusting the at least one parameter, the difference may be reduced. Such adjustment may be made real-time during production of the 3D object. Alternatively, such adjusting may be performed as part of an off-line type calibration for the additive manufacturing system 202.

According to an example embodiment, the printing stage 220 may be a 3D printer that may include a laser scanner, camera, or other suitable device for measuring a 3D object. A scaling calibration method may be performed that may comprise printing the 3D object to produce the 3D object 224, sintering the 3D object 224 at a processing station, and scanning the 3D object 224 post-sinter to perform a closed loop scaling calibration so new materials can be qualified and a customer (i.e., user) can fabricate the 3D object with accurate shrink based on, for example, gas conditions of a unique oven at the customer's site. Such a scaling calibration method may be useful to the user in an event multiple different feedstocks are being used or in an event the unique oven was leaky or became leaky over time, resulting in an unexpected shrinkage of the 3D object. By measuring such shrinkage, the calibration method may automatically adjust at least one parameter that may be a furnace parameter to account for such unexpected shrinkage and, thus, improve tolerances. Unexpected mass loss or deformation from debind may also occur at a processing station that may be a debinding station. As such the calibration method may de-bind the 3D printed object and scan the 3D printed object post-de-bind to perform the closed loop scaling calibration by adjusting at least one parameter controlling the de-bind process.

The calibration method may employ a calibration part for the 3D object 224. The calibration part may be based on a 3D model that may be based on a specific geometry targeted for such calibration. The 3D model of the calibration part may be specifically designed to test for specific artifacts of the processing stage that may be a debinding stage or a sintering stage.

According to an example embodiment, the raft of the 3D object, such as the base plate 352 or the raft 452 disclosed in FIG. 3 and FIG. 4 above, respectively, may be employed for monitoring and adjusting at least one parameter of the 3D printing system, such as the additive manufacturing system 202 of FIG. 2, disclosed above. According to an example embodiment, a feature, such as a fiducial, may be added to the 3D object or the raft during printing, such as disclosed above with reference to FIG. 4. Values associated with characteristics (e.g., data) regarding such a feature may be collected on a per-object basis for each 3D object being produced to continuously update scale factors of a corresponding 3D model or to update other printing parameters, debinding parameters, sintering parameters, or any other suitable parameters employed by the 3D printing system for producing the 3D object in final form.

Specific designs for a 3D model may be employed that specifically test for artifacts due to a debinding or sintering process. For example, the 3D model may represent a 3D object that includes an array of cubes with different heights and ceramic interface pattern. The 3D object may be attached to a shrink raft, and an example embodiment may measure shrinkage versus height that may have an unexpected value due to creep effects and curvature due to pinning. Such measurements may be employed to adjust parameters in the 3D model to overcome such processing effects by determining the printed geometry needed to give the desired final dimensions.

An example embodiment may measure at least one characteristic, such as a small pattern of a 3D object being produced by the 3D printing system, measure temperatures, pressures, and combine such information with a supplier's data on the build material and data regarding setting of a processing stage to determine how to scale a 3D model for producing a 3D object of accurate final size.

According to an example embodiment, at least one parameter may be adjusted in real-time to hit a dimensional target. An optical or physical measurement of the part or a reference feature may enable adjustment of vacuum, time, gas flow, temperature, or any other suitable parameter of a processing stage to achieve an accurate final size.

According to an example embodiment, the at least one characteristic may be obtained after printing the object and after sintering the object to determine a processing effect, such as a sintering effect in the example embodiment. By monitoring the at least one characteristic in this way, such as by measuring the at least one characteristic, the 3D model or a parameter of the processing stage, such as a parameter of the sintering process in the example embodiment, may be adjusted in order to produce the 3D object with fidelity.

According to an example embodiment, calibration may be performed in response to a change in feedstock or a change in part design, such as defined by a change of a 3D model employed for printing.

The following discloses various embodiments within which an example embodiment disclosed above may be implemented. The following disclosure emphasizes 3D printing using metal as a build material for forming a three-dimensional object. A variety of commercially available compositions have been engineered for metal injection molding ("MIM"). These highly engineered materials can also be adapted for use as a build material in printing techniques such as fused filament fabrication ("FFF") or other fabrication techniques, such as stereolithography or binderjetting. Any reference to "MIM materials," "powder metallurgy materials," "MIM feedstocks," or the like shall generally refer to powder and binder, such as metal powder and/or ceramic powder mixed with one or more binding materials, e.g., a backbone binder and/or another binder that is pulled out during the debind process. The debind process may be a thermal or solvent debind process.

These materials, or other materials similarly composed of metal powder and a binder system, may be used to fabricate 3D objects that can be processed to produce a final 3D object (also referred to interchangeably herein as a desired part). For example, the 3D object may be de-bound and sintered into a fully densified 3D object that may include a metal, a metal alloy, a ceramic, or any other suitable material or combination of materials.

Figure 6:
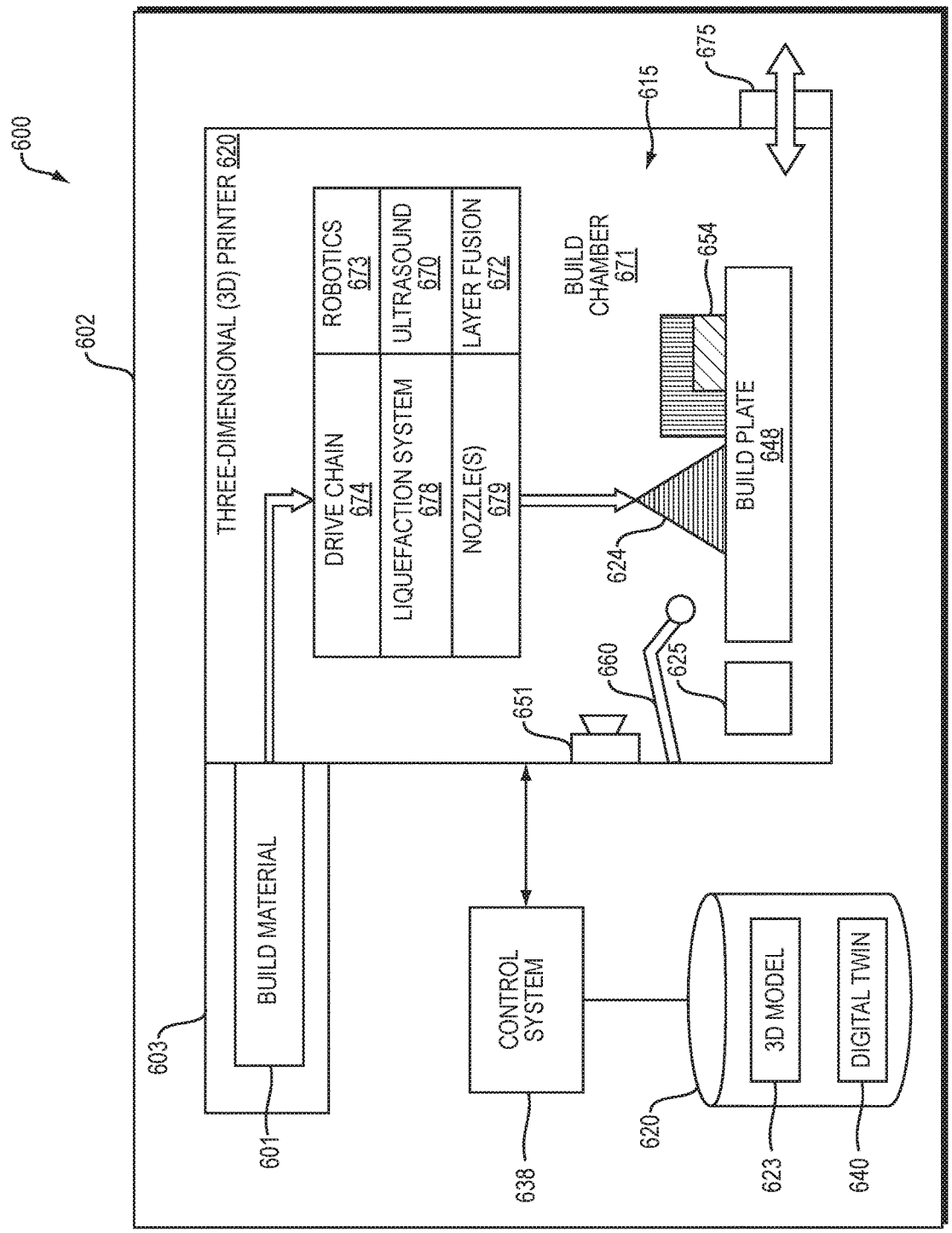
FIG. 6 is a block diagram of yet another example embodiment of an additive manufacturing system.

FIG. 6 is a block diagram 620 of yet another example embodiment of an additive manufacturing system 602 in which various embodiments as disclosed above may be implemented. The additive manufacturing system 602 may include a 3D printer 620 that deposits metal using fused filament fabrication. Fused filament fabrication is well known in the art, and may be usefully employed for additive manufacturing with suitable adaptations to accommodate the forces, temperatures and other environmental requirements typical of the metallic injection molding materials disclosed herein. In general, the printer 620 may include a build material 601 that is propelled by a drive train 674 and heated to a workable state by a liquefaction system 678, and then dispensed through one or more nozzles 679. By concurrently controlling robotic system 673 to position the nozzle(s) along an extrusion path, an object 624 may be fabricated on a build plate 648 within a build chamber 671. In general, a control system 638 manages operation of the printer 620 to fabricate the object 624 according to a three-dimensional model using a fused filament fabrication process or the like.

A variety of commercially available compositions have been engineered for metal injection molding ("MIM"). These highly engineered materials can also be adapted for use as a build material 601 in printing techniques such as fused filament fabrication. For example, MIM feedstock materials, with suitable polymers and powder size, may be usefully extruded through nozzles typical of commercially available FFF machines, and are generally flowable or extrudable within typical operating temperatures (e.g., 0-600 degrees Celsius) of such machines. An operating range may be dependent upon polymers in the feedstock. For example, an operating range may be 150 C-290 C, or any other suitable range where the polymers have an appropriate viscosity for printing. This temperature range may depend on the binder—e.g., some binders achieve appropriate viscosities at about 205 degrees Celsius, while others achieve appropriate viscosities at lower or higher temperatures such as about 660-180 C degrees Celsius. One of ordinary skill will recognize that these ranges (and all ranges listed herein) are provided by way of example and not of limitation. Further, while there are no formal limits on the dimensions for powder metallurgy materials, parts with dimensions up to 600 millimeters on each side have been demonstrated to perform well for FFF fabrication of net shape green bodies. Any smaller dimensions may be usefully employed, for example, MIM parts may typically have dimensions below 60 mm on each axis, and larger dimensions may also be employed provided they are consistent with processing dimensions such as the print resolution and the extrusion orifice diameter that may have a target range from 100 μm to 1 mm. For example, implementations may target about a 400 μm diameter extrusion, and the MIM metal powder may typically be about 1~100 μm diameter, although nano sized powders can be used. The term metal injection molding material, as used herein, may include any such engineered materials, as well as other fine powder bases such as ceramics in a similar binder suitable for injection molding. Thus, where the term metal injection molding or the commonly used abbreviation, MIM, is used, the term may include injection molding materials using powders other than, or in addition to, metals and, thus, may include ceramics. Also, any reference to "MIM materials," "powder metallurgy materials," "MIM feedstocks," or the like may generally refer to metal powder and/or ceramic powder mixed with one or more binding materials. Other material systems may be suitable for fabricating metal parts using fabrication techniques such as stereolithography or binder jetting, some of which are disclosed in greater detail below. Such fabrication techniques may, in some applications, be identical to techniques for fabricating parts from ceramic material.

In general, fabrication of such materials may proceed as with a conventional FFF process, except that after the net shape is created, the green part may be optionally machined or finished while in a more easily workable state, and then de-bound and sintered into a final, dense object using any of the methods common in the art for MIM materials. The final object, as disclosed above, may include a metal, a metal alloy, a ceramic, or another suitable combination of materials.

The build material 601 may be fed from a carrier 603 configured to dispense the build material to the three-dimensional printer either in a continuous (e.g., wire) or discrete (e.g., billet) form. The build material 601 may for example be supplied in discrete units one by one as billets or the like or as a rod into an intermediate chamber for delivery into the build chamber 638 and subsequent melt and deposition. In another aspect, the carrier 603 may include a spool or cartridge containing the build material 601 in a wire form. Where a vacuum or other controlled environment is desired, the wire may be fed through a vacuum gasket into the build chamber 638 in a continuous fashion, however, typical MIM materials can be heated to a workable plastic state under normal atmospheric conditions, except perhaps for filtering or the like to remove particles from the build chamber 671. Thus in one aspect, there is disclosed herein an apparatus including a MIM build material formed into a wire, the build material including an engineered composite of metal powder and a polymeric binder or the like, wherein the carrier 603 is configured to dispense the build material in a continuous feed to a three-dimensional printer. For environmentally sensitive materials, the carrier 603 may provide a vacuum environment for the build material 601 that can be directly or indirectly coupled to the vacuum environment of the build chamber 638. More generally, the build chamber 638 (and the carrier 603) may maintain any suitably inert environment for handling of the build material 601, such as a vacuum, and oxygen-depleted environment, an inert gas environment, or some gas or combination of gasses that are not reactive with the build material 601 where such conditions are necessary or beneficial during three-dimensional fabrication. It should be understood that an atmosphere for printing is relevant to the processing of the binders. For example, atmospheric control may not be employed if the binder or metal/ceramic is not reactive with the environment at the printing temperature.

A drive train 674 may include any suitable gears, compression pistons, or the like for continuous or indexed feeding of the build material 601 into the liquefaction system 678. In one aspect, the drive train 674 may include gear shaped to mesh with corresponding features in the build material such as ridges, notches, or other positive or negative detents. In another aspect, the drive train 674 may use heated gears or screw mechanisms to deform and engage with the build material. Thus there is disclosed in one aspect a printer for a fused filament fabrication process that heats a build material to a working temperature, and that heats a gear that engages with, deforms, and drives the composite in a feed path. A screw feed may also or instead be used.

For more brittle MIM materials, a fine-toothed drive gear of a material such as a hard resin or plastic may be used to grip the material without excessive cutting or stress concentrations that might otherwise crack, strip, or otherwise compromise the build material.

In another aspect, the drive train 674 may use bellows, or any other collapsible or telescoping press to drive rods, billets, or similar units of build material into the liquefaction system 678. Similarly, a piezoelectric or linear stepper drive may be used to advance a unit of build media in a non-continuous, stepped method with discrete, high-powered mechanical increments. In another aspect, the drive train 674 may include multiple stages. In a first stage, the drive train 674 may heat the composite material and form threads or other features that can supply positive gripping traction into the material. In the next stage, a gear or the like matching these features can be used to advance the build material along the feed path. A collet feed may be used (e.g., similar to those on a mechanical pencil). A soft wheel or belt drive may also or instead be used. In an aspect, a shape forming wheel drive may be used to ensure accuracy of size and thus the build. More generally, the drive train 674 may include any mechanism or combination of mechanisms used to advance build material 601 for deposition in a three-dimensional fabrication process.

The liquefaction system 678 may be any liquefaction system configured to heat the composite to a working temperature in a range suitable for extrusion in a fused filament fabrication process. Any number of heating techniques may be used. In one aspect, electrical techniques such as inductive or resistive heating may be usefully applied to liquefy the build material 601. This may, for example include inductively or resistively heating a chamber around the build material 601 to a temperature at or near the glass transition temperature of the build material 601, or some other temperature where the binder or other matrix becomes workable, extrudable, or flowable for deposition as disclosed herein. Where the contemplated build materials are sufficiently conductive, they may be directly heated through contact methods (e.g., resistive heating with applied current) or non-contact methods (e.g., induction heating using an external electromagnet to drive eddy currents within the material). The choice of additives may further be advantageously selected to provide bulk electrical characteristics (e.g., conductance/resistivity) to improve heating. When directly heating the build material 601, it may be useful to model the shape and size of the build material 601 in order to better control electrically-induced heating. This may include estimates or actual measurements of shape, size, mass, etc.

In the above context, "liquefaction" does not require complete liquefaction. That is, the media to be used in printing may be in a multi-phase state, and/or form a paste or the like having highly viscous and/or non-Newtonian fluid properties. Thus the liquefaction system 678 disclosed herein may include, more generally, any system that places a build material 601 in condition for use in fabrication as disclosed herein.

In order to facilitate resistive heating of the build material 601, one or more contact pads, probes or the like may be positioned within the feed path for the material in order to provide locations for forming a circuit through the material at the appropriate location(s). In order to facilitate induction heating, one or more electromagnets may be positioned at suitable locations adjacent to the feed path and operated, e.g., by the control system 638, to heat the build material internally through the creation of eddy currents. In one aspect, both of these techniques may be used concurrently to achieve a more tightly controlled or more evenly distributed electrical heating within the build material. The printer 620 may also be instrumented to monitor the resulting heating in a variety of ways. For example, the printer 620 may monitor power delivered to the inductive or resistive circuits. The printer 620 may also or instead measure temperature of the build material 601 or surrounding environment at any number of locations. In another aspect, the temperature of the build material 601 may be inferred by measuring, e.g., the amount of force required to drive the build material 601 through a nozzle 679 or other portion of the feed path, which may be used as a proxy for the viscosity of the build material 601. More generally, any techniques suitable for measuring temperature or viscosity of the build material 601 and responsively controlling applied electrical energy may be used to control liquefaction for a fabrication process using composites as disclosed herein.

The liquefaction system 678 may also or instead include any other heating systems suitable for applying heat to the build material 601 to a suitable temperature for extrusion. This may, for example include techniques for locally or globally augmenting heating using, e.g., chemical heating, combustion, ultrasound heating, laser heating, electron beam heating or other optical or mechanical heating techniques and so forth.

The liquefaction system 678 may include a shearing engine. The shearing engine may create shear within the composite as it is heated in order to maintain a mixture of the metallic base and a binder or other matrix, or to maintain a mixture of various materials in a paste or other build material. A variety of techniques may be employed by the shearing engine. In one aspect, the bulk media may be axially rotated as it is fed along the feed path into the liquefaction system 678. In another aspect, one or more ultrasonic transducers may be used to introduce shear within the heated material. Similarly, a screw, post, arm, or other physical element may be placed within the heated media and rotated or otherwise actuated to mix the heated material. In an aspect, bulk build material may include individual pellets, rods, or coils (e.g., of consistent size) and fed into a screw, a plunger, a rod extruder, or the like. For example, a coiled build material can be uncoiled with a heater system including a heated box, heated tube, or heater from the printer head. Also, a direct feed with no heat that feeds right into the print head is also possible.

The robotic system 673 may include a robotic system configured to three-dimensionally position the nozzle 679 within the working volume 615 of the build chamber 671. This may, for example, include any robotic components or systems suitable for positioning the nozzle 679 relative to the build plate 648 while depositing the composite in a pattern to fabricate the object 624. A variety of robotics systems are known in the art and suitable for use as the robotic system 673 disclosed herein. For example, the robotics may include a Cartesian or xy-z robotics system employing a number of linear controls to move independently in the x-axis, the y-axis, and the z-axis within the build chamber 671. Delta robots may also or instead be usefully employed, which can, if properly configured, provide significant advantages in terms of speed and stiffness, as well as offering the design convenience of fixed motors or drive elements. Other configurations such as double or triple delta robots can increase range of motion using multiple linkages. More generally, any robotics suitable for controlled positioning of the nozzle 679 relative to the build plate 648, especially within a vacuum or similar environment, may be usefully employed including any mechanism or combination of mechanisms suitable for actuation, manipulation, locomotion and the like within the build chamber 671.

The nozzle(s) 679 may include one or more nozzles for dispensing the build material 601 that has been propelled with the drive train 674 and heated with the liquefaction system 678 to a suitable working temperature. In a multi-phase extrusion this may include a working temperature above the melting temperature of the metallic base of the composite, or more specifically between a first temperature at which the metallic base melts and the second temperature (above the first temperature) at which a second phase of the composite remains inert.

The nozzles 679 may, for example, be used to dispense different types of material so that, for example, one nozzle 679 dispenses a composite build material while another nozzle 679 dispenses a support material in order to support bridges, overhangs, and other structural features of the object 624 that would otherwise violate design rules for fabrication with the composite build material. In another aspect, one of the nozzles 679 may deposit a different type of material, such as a thermally compatible polymer or a metal or polymer loaded with fibers of one or more materials to increase tensile strength or otherwise improve mechanical properties of the resulting object 624. In an aspect, two types of supports may be used—(1) build supports and (2) sinter supports—e.g., using different materials printed into the same part to achieve these supports, or to create a distinguishing junction between these supports and the part.

The nozzle 679 may preferably be formed of a material or combination of materials with suitable mechanical and thermal properties. For example, the nozzle 679 will preferably not degrade at the temperatures wherein the composite material is to be dispensed, or due to the passage of metallic particles through a dispensing orifice therein. While nozzles for traditional polymer-based fused filament fabrication may be made from brass or aluminum alloys, a nozzle that dispenses metal particles may be formed of harder materials, or materials compatible with more elevated working temperatures such as a high carbon steel that is hardened and tempered. Other materials such as a refractory metal (e.g. molybdenum, tungsten) or refractory ceramic (e.g., mullite, corundum, magnesia) may also or instead be employed. In some instances, aluminum nozzles may instead be used for MIM extrusion of certain MIM materials. In another aspect, a softer thermally conductive material with a hard, wear-resistant coating may be used, such as copper with a hard nickel plating.

In one aspect, the nozzle 679 may include one or more ultrasound transducers 670 as disclosed herein. Ultrasound may be usefully applied for a variety of purposes in this context. In one aspect, the ultrasound energy may facilitate extrusion by mitigating clogging by reducing adhesion of a build material to an interior surface of the nozzle 679. A variety of energy director techniques may be used to improve this general approach. For example, a deposited layer may include one or more ridges, which may be imposed by an exit shape of the nozzle 679, to present a focused area to receive ultrasound energy introduced into the interface between the deposited layer and an adjacent layer.

In another aspect, the nozzle 679 may include an induction heating element, resistive heating element, or similar components to directly control the temperature of the nozzle 679. This may be used to augment a more general liquefaction process along the feed path through the printer 620, e.g., to maintain a temperature of the build material 601 during fabrication, or this may be used for more specific functions, such as de-clogging a print head by heating the build material 601 substantially above the working range, e.g., to a temperature where the composite is liquid. While it may be difficult or impossible to control deposition in this liquid state, the heating can provide a convenient technique to reset the nozzle 679 without more severe physical intervention such as removing vacuum to disassemble, clean, and replace the affected components.

In another aspect, the nozzle 679 may include an inlet gas or fan, e.g., an inert gas, to cool media at the moment it exits the nozzle 679. The resulting gas jet may, for example, immediately stiffen the dispensed material to facilitate extended bridging, larger overhangs, or other structures that might otherwise require support structures underneath.

The object 624 may be any object suitable for fabrication using the techniques disclosed herein. This may include functional objects such as machine parts, aesthetic objects such as sculptures, or any other type of objects, as well as combinations of objects that can be fit within the physical constraints of the build chamber 671 and build plate 648. Some structures such as large bridges and overhangs cannot be fabricated directly using fused filament fabrication or the like because there is no underlying physical surface onto which a material can be deposited. In these instances, a support structure 654 may be fabricated, preferably of a soluble or otherwise readily removable material, in order to support the corresponding feature.

Where multiple nozzles 679 are provided, a second nozzle may usefully provide any of a variety of additional build materials. This may, for example, include other composites, alloys, bulk metallic glass's, thermally matched polymers and so forth to support fabrication of suitable support structures. In one aspect, one of the nozzles 679 may dispense a bulk metallic glass that is deposited at one temperature to fabricate a support structure 654, and a second, higher temperature at an interface 675 to a printed object 624 where the bulk metallic glass can be crystallized at the interface to become more brittle and facilitate mechanical removal of the support structure 654 from the object 624. Conveniently, the bulk form of the support structure 654 can be left in the super-cooled state so that it can retain its bulk structure and be removed in a single piece. Thus in one aspect there is disclosed herein a printer that fabricates a portion of a support structure 654 with a bulk metallic glass in a super-cooled liquid region, and fabricates a layer of the support structure adjacent to a printed object at a greater temperature in order to crystalize the build material 601 into a non-amorphous alloy. The bulk metallic glass particles may thus be loaded into a MIM feedstock binder system and may provide a support. Pure binding or polymer materials (e.g., without any loading) may also or instead provide a support. A similar metal MIM feedstock may be used for multi-material part creation. Ceramic or dissimilar metal MIM feedstock may be used for a support interface material.

Support Materials

In general, the MIM media includes a binder and a metal powder (or other material as disclosed herein, such as ceramic powder). A support material may also be provided from a second nozzle consisting of, e.g., the binder used for the injection molding material, without the structural material that sinters into the final object. In another aspect, the support material may be formed of a wax, or some other thermoplastic or other polymer that can be removed during processing of a printed green body. This support material may, for example, be used for vertical supports, as well as for top or side supports, or any other suitable support structures to provide a physical support during printing and subsequent sintering. Printing and sintering may impose different support requirements. As such, different support materials and or different support rules may be employed for each type of required support. Additionally, the print supports may be removed after a print and before sintering, while sintering supports would be left attached to the green object until sintering is completed (or sufficiently completed to eliminate the need for the sintering support structures).

In another aspect, the second nozzle (or a third nozzle) may be used to provide an interface material that is different from the support material, such as the corresponding binder, along with a ceramic or some other material that will not sinter under the time and temperature conditions used to sinter the injection molding material. This may also or instead include a metal or the like that forms a brittle interface with the sintered part so that it can break away from the final object easily after sintering. Where this interface material does not sinter, it may be used in combination with a sinterable support structure that can continue to provide structural support during a sintering process.

The support material(s) may usefully integrate other functional substances. For example, titanium may be added to the support material as an oxygen getter to improve the build environment without introducing any titanium into the fabricated object. Other types of additives may also or instead be used to remove contaminants. For example, a zirconium powder (or other strong carbide former) may be added to the support material in order to extract carbon contamination during sintering.

Nested Parts

In one aspect, the use of non-structural support at the interface, e.g. A pure binder that does not sinter into a structural object, may be used to facilitate the additive manufacture of nested parts. For example, a complete gear box or the like may be fabricated within an enclosure, with the surfaces between gear teeth fabricated with a non-sintering binder or other material. In one aspect, critical mechanical interfaces for such mechanical parts may be oriented to the fabrication process, e.g., by orienting mating surfaces vertically so that smaller resolutions can be used. More generally, the capability to print adjacent, non-coupled parts may be used to fabricate multiple physically related parts in a single print job. This may, for example, include hinges, gears, captive bearings or other nested or interrelated parts. Non-sintering support material may be extracted, e.g., using an ultrasonicator, fluid cleaning, or other techniques after the object is sintered to a final form. In an aspect, the binder is loaded with a non-sintering additive such as ceramic or dissimilar, higher sintering temp metal.

This general approach may also affect the design of the part. For example, axles may employ various anti-backlash techniques so that the sintered part is more securely retained during movement and use. Similarly, fluid paths may be provided for fluid cleaning, and removal paths may be created for interior support structures. This technique may also be used to address other printing challenges. For example, support structures within partially enclosed spaces may be fabricated for removal through some removal path after the object is completed. If the support structures are weakly connected, or unconnected, to the fabricated object, they can be physically manipulated for extraction through the removal path. In an aspect, parts may be "glued" together with an appropriate (e.g., the same) MIM material to make larger parts that essentially have no joints once sintered.

The build plate 648 within the working volume 615 of the build chamber 671 may include a rigid and substantially planar surface formed of any substance suitable for receiving deposited composite or other material(s)s from the nozzles 679. In one aspect, the build plate 648 may be heated, e.g., resistively or inductively, to control a temperature of the build chamber 671 or the surface upon which the object 624 is being fabricated. This may, for example, improve adhesion, prevent thermally induced deformation or failure, and facilitate relaxation of stresses within the fabricated object. In another aspect, the build plate 648 may be a deformable build plate that can bend or otherwise physical deform in order to detach from the rigid object 624 formed thereon.

The build chamber 671 may be any chamber suitable for containing the build plate 648, an object 624, and any other components of the printer 620 used within the build chamber 671 to fabricate the object 624. In one aspect, the build chamber 671 may be an environmentally sealed chamber that can be evacuated with a vacuum pump 624 or similar device in order to provide a vacuum environment for fabrication. This may be particularly useful where oxygen causes a passivation layer that might weaken layer-to-layer bonds in a fused filament fabrication process as disclosed herein, or where particles in the atmosphere might otherwise interfere with the integrity of a fabricated object, or where the build chamber 671 is the same as the sintering chamber. In another aspect, only oxygen is removed from the build chamber 671.

Similarly, one or more passive or active oxygen getters 625 or other similar oxygen absorbing material or system may usefully be employed within the build chamber 671 to take up free oxygen within the build chamber 671. The oxygen getter 625 may, for example, include a deposit of a reactive material coating an inside surface of the build chamber 671 or a separate object placed therein that completes and maintains the vacuum by combining with or absorbing residual gas molecules. The oxygen getters 625, or more generally, gas getters, may be deposited as a support material using one of the nozzles 679, which facilitates replacement of the gas getter with each new fabrication run and can advantageously position the gas getter(s) near printed media in order to more locally remove passivating gasses where new material is being deposited onto the fabricated object. In one aspect, the oxygen getters 625 may include any of a variety of materials that preferentially react with oxygen including, e.g., materials based on titanium, aluminum, and so forth. In another aspect, the oxygen getters 625 may include a chemical energy source such as a combustible gas, gas torch, catalytic heater, Bunsen burner, or other chemical and/or combustion source that reacts to extract oxygen from the environment. There are a variety of low-CO and NOx catalytic burners that may be suitably employed for this purpose without CO.

In one aspect, the oxygen getter 625 may be deposited as a separate material during a build process. Thus in one aspect there is disclosed herein a process for fabricating a three-dimensional object from a metallic composite including co-fabricating a physically adjacent structure (which may or may not directly contact the three-dimensional object) containing an agent to remove passivating gasses around the three-dimensional object. Other techniques may be similarly employed to control reactivity of the environment within the build chamber 671, or within processing chambers or the like as disclosed below. For example, the build chamber 671 may be filled with an inert gas or the like to prevent oxidation.

The control system 638 may include a processor and memory, as well as any other co-processors, signal processors, inputs and outputs, digital-to-analog or analog-to-digital converters and other processing circuitry useful for monitoring and controlling a fabrication process executing on the printer 620. The control system 638 may be coupled in a communicating relationship with a supply of the build material 601, the drive train 674, the liquefaction system 678, the nozzles 679, the build plate 648, the robotic system 673, and any other instrumentation or control components associated with the build process such as temperature sensors, pressure sensors, oxygen sensors, vacuum pumps, and so forth. The control system 638 may be operable to control the robotic system 673, the liquefaction system 678 and other components to fabricate an object 624 from the build material 601 in three dimensions within the working volume 615 of the build chamber 671.

The control system 638 may generate machine ready code for execution by the printer 620 to fabricate the object 624 from the three-dimensional model 623. The control system 638 may deploy a number of strategies to improve the resulting physical object structurally or aesthetically. For example, the control system 638 may use plowing, ironing, planing, or similar techniques where the nozzle 679 runs over existing layers of deposited material, e.g., to level the material, remove passivation layers, apply an energy director topography of peaks or ridges to improve layer-to-layer bonding, or otherwise prepare the current layer for a next layer of material. The nozzle 679 may include a low-friction or non-stick surface such as Teflon, TiN or the like to facilitate this plowing process, and the nozzle 679 may be heated and/or vibrated (e.g., using an ultrasound transducer) to improve the smoothing effect. In one aspect, this surface preparation may be incorporated into the initially-generated machine ready code. In another aspect, the printer 620 may dynamically monitor deposited layers and determine, on a layer-by-layer basis, whether additional surface preparation is necessary or helpful for successful completion of the object.

In general, a three-dimensional model 623 of the object may be stored in a database 120 such as a local memory of a computer used as the control system 638, or a remote database accessible through a server or other remote resource, or in any other computer-readable medium accessible to the control system 638. The control system 638 may retrieve a particular three-dimensional model 623 in response to user input, and generate machine-ready instructions for execution by the printer 620 to fabricate the corresponding object 624. This may include the creation of intermediate models, such as where a CAD model is converted into an STL model or other polygonal mesh or other intermediate representation, which can in turn be processed to generate machine instructions for fabrication of the object 624 by the printer 620.

In another aspect, the nozzle 679 may include one or more mechanisms to flatten a layer of deposited material and apply pressure to bond the layer to an underlying layer. For example, a heated nip roller, caster, or the like may follow the nozzle 679 in its path through an x-y plane of the build chamber to flatten the deposited (and still pliable) layer. The nozzle 679 may also or instead integrate a forming wall, planar surface or the like to additionally shape or constrain a build material 601 as it is deposited by the nozzle 679. The nozzle 679 may usefully be coated with a non-stick material (which may vary according to the build material being used) in order to facilitate more consistent shaping and smoothing by this tool.

In another aspect, a layer fusion system 672 may be used to encourage good mechanical bonding between adjacent layers of deposited build material within the object 624. This may include the ultrasound transducers disclosed above, which may be used to facilitate bonding between layers by applying ultrasound energy to an interface between layers during deposition. In another aspect, current may be passed through an interface between adjacent layers in order to Joule heat the interface and liquefy or soften the materials for improved bonding. Thus in one aspect, the layer fusion system 672 may include a joule heating system configured to apply a current between a first layer of the build material and a second layer of the build material in the working volume 615 while the first layer is being deposited on the second layer. In another aspect, the layer fusion system 672 may include an ultrasound system for applying ultrasound energy to a first layer of the build material while the first layer is being deposited onto a second layer of the build material in the working volume 615. In another aspect, the layer fusion system 672 may include a rake, ridge(s), notch(es) or the like formed into the end of the nozzle 679, or a fixture or the like adjacent to the nozzle, in order to form energy directors on a top surface of a deposited material. Other techniques may also or instead be used to improve layer-to-layer bonding, such as plasma cleaning or other depassivation before or during formation of the interlayer bond. The use of injection molding materials can alleviate many of the difficulties of forming layer-to-layer bonds with deposited metals, but these and other techniques may nonetheless be useful in improving interlayer bonds and/or shaping a fabricated object as disclosed herein.

During fabrication, detailed data may be gathered for subsequent use and analysis. This may, for example, include a camera and computer vision system that identifies errors, variations, or the like that occur in each layer of an object. Similarly, tomography or other imaging techniques may be used to detect and measure layer-to-layer interfaces, aggregate part dimensions, diagnostic information (e.g., defects, voids) and so forth. This data may be gathered and delivered with the object to an end user as a digital twin 640 of the object 624 so that the end user can evaluate whether and how variations and defects might affect use of the object 624. In addition to spatial/geometric analysis, the digital twin 640 may log process parameters including, for example, aggregate statistics such as mass of material used, time of print, variance of build chamber temperature, and so forth, as well as chronological logs of any process parameters of interest such as volumetric deposition rate, material temperature, environment temperature, and so forth.

The printer 620 may include a camera 651 or other optical device. In one aspect, the camera 651 may be used to create the digital twin 640 disclosed above, or to more generally facilitate machine vision functions or facilitate remote monitoring of a fabrication process. Video or still images from the camera 651 may also or instead be used to dynamically correct a print process, or to visualize where and how automated or manual adjustments should be made, e.g., where an actual printer output is deviating from an expected output.

The printer 620 may also usefully integrate a subtractive fabrication tool 660 such as a drill, milling bit, or other multi-axis controllable tool for removing material from the object 624 that deviates from an expected physical output based on the 3D model 623 used to fabricate the object 624. While combinations of additive and subtractive technologies have been disclosed, the use of MIM materials provides a unique advantage when subtractive shaping is performed on a green object after net shape forming but before sintering (or debinding), when the object 624 is relatively soft and workable. This permits quick and easy removal of physically observable defects and printing artifacts before the object 624 is sintered into a metal object. An aspect may instead include tapping threads or otherwise adding features as opposed to subtracting parts. Similarly, an aspect may include combining multiple single green parts into one larger fully solid sintered part.

Other useful features may be integrated into the printer 620 disclosed above. For example, a solvent or other material may be usefully applied a surface of the object 624 during fabrication to modify its properties. This may, for example intentionally oxidize or otherwise modify the surface at a particular location or over a particular area in order to provide a desired electrical, thermal optical, or mechanical property. This capability may be used to provide aesthetic features such as text or graphics, or to provide functional features such as a window for admitting RF signals.

In general, a fabrication process such as fused filament fabrication implies, or expressly includes, a set of design rules to accommodate physical limitations of a fabrication device and a build material. For example, a horizontal shelf cannot be fabricated without positioning a support structure underneath. While the design rules for FFF may apply to fabrication of a green body using FFF techniques as disclosed herein, the green body may also be subject to various MIM design rules. This may, for example, include a structure to prevent or minimize drag on a floor while a part shrinks during sintering which may be 20% or more depending on the composition of the green body. Similarly, certain supports are required during sintering that are different than the supports required during fused filament fabrication. As another example, injection molding typically aims for uniform wall thickness to reduce variability in debinding and/or sintering behaviors, with thinner walls being preferred. The system disclosed herein may apply to disparate sets of design rules—those for the rapid prototyping system (e.g., fused filament fabrication) and those for the sintering process (e.g., MIM design rules)—to a CAD model that is being prepared for fabrication.

These rules may also be combined under certain conditions. For example, the support structures for a horizontal shelf during fabrication must resist the force of an extrusion/deposition process used to fabricate the horizontal shelf, whereas the support structure during sintering only needs to resist the forces of gravity during the baking process. Thus there may be two separate supports that are removed at different times during a fabrication process: the fabrication supports that are configured to resist the force of a fabrication process and may be breakaway supports that are loosely mechanically coupled to a green body, along with sintering supports that may be less extensive, and only need to resist the gravitation forces on a body during sintering. These latter supports are preferably coupled to the object through a nonsinterable layer to permit easy removal from the densified final object. In another aspect, the fabrication supports may be fabricated from binder without a powder or other fill so that they completely disappear during a sintering process.

Figure 7:
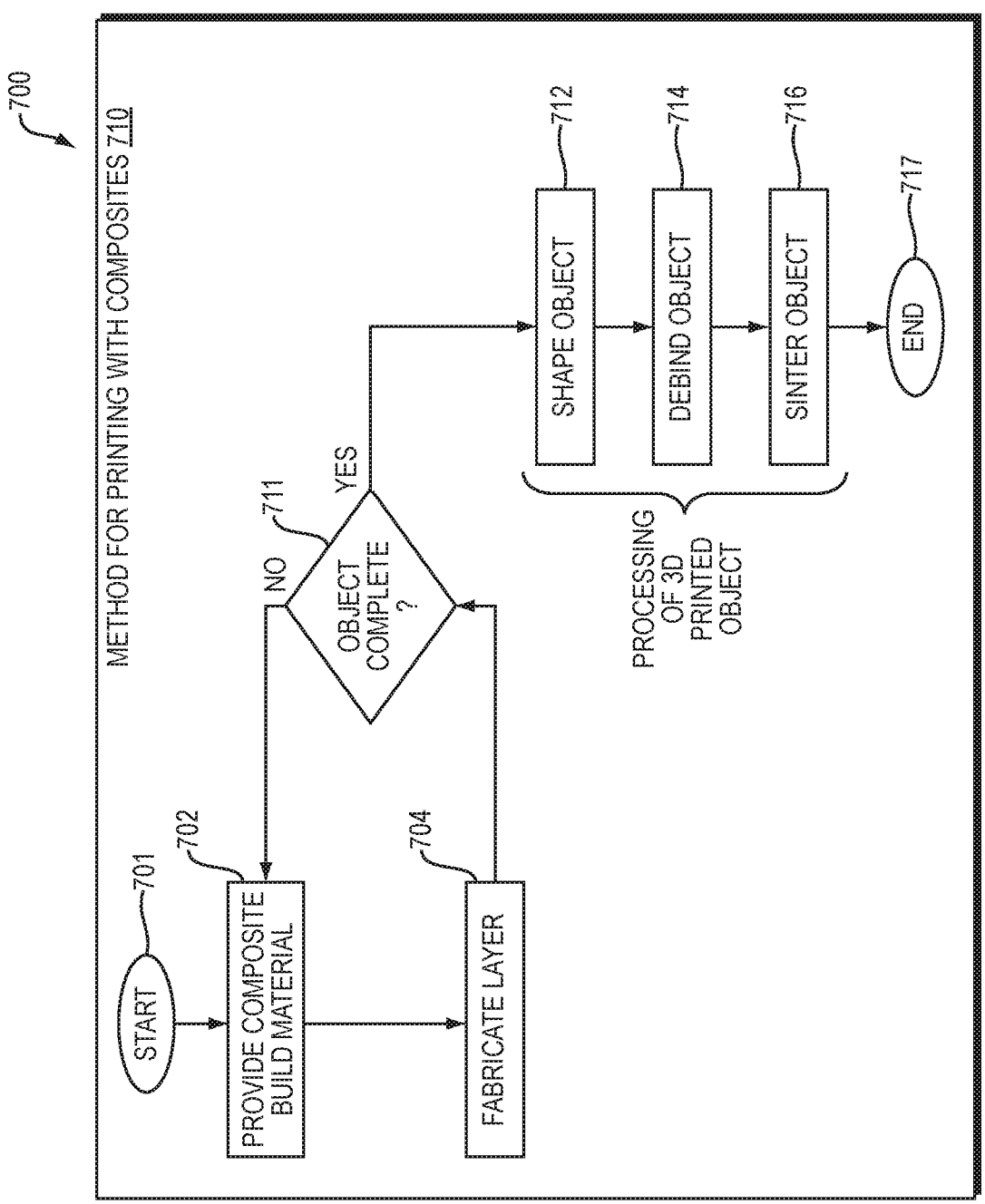
FIG. 7 is a flow diagram of an example embodiment of a method for printing with composites.

FIG. 7 is a flow diagram 700 of an example embodiment of a method (710) for printing with composites, e.g., metal injection molding materials. The method may begin (701) and provide a build material including an injection molding material (702), or where a support interface is being fabricated, a MIM binder (e.g., a MIM binder with similar thermal characteristics). The material may include, for example, any of the MIM materials disclosed herein. The material may be provided as a build material in a billet, a wire, or any other cast, drawn, extruded or otherwise shaped bulk form. As disclosed above, the build material may be further packaged in a cartridge, spool, or other suitable carrier that can be attached to an additive manufacturing system for use.

The method may fabricate a layer of an object (704). This may include any techniques that can be adapted for use with MIM materials. For example, this may include fused filament fabrication, jet printing, selective laser sintering, or any other techniques for forming a net shape from a MIM material (and more specifically for techniques used for forming a net shape from a polymeric material loaded with a second phase powder).

The method may check for whether the object is complete (711) and if not, may be continued and repeated as necessary to fabricate an object within the working volume. While the method may vary according to the underlying fabrication technology, an object can generally be fabricated layer by layer based on a three-dimensional model of the desired object. The method may shape the net shape object after the additive process is complete (712). Before debinding or sintering, the green body form of the object is usefully in a soft, workable state where defects and printing artifacts can be easily removed, either manually or automatically. Thus, the method may take advantage of this workable, intermediate state to facilitate quality control or other process-related steps, such as removal of supports that are required for previous printing steps, but not for debinding or sintering.

The method may debind the printed object (714). In general, debinding may be performed chemically or thermally to remove a binder that retains a metal (or ceramic or other) powder in a net shape. Contemporary injection molding materials are often engineered for thermal debinding, which advantageously permits debinding and sintering to be performed in a single baking operation, or in two similar baking operations. In general, the debinding process functions to remove binder from the net shape green object, thus leaving a very dense structure of metal (or ceramic or other) particles that can be sintered into the final form.

The method may sinter the printed and debound object into a final form (716), and the method thereafter ends (717) in the example embodiment. In general, sintering may be any process of compacting and forming a solid mass of material by heating without liquefaction. During a sintering process, atoms can diffuse across particle boundaries to fuse into a solid piece. Because sintering can be performed at temperatures below the melting temperature, this advantageously permits fabrication with very high melting point materials such as tungsten and molybdenum.

Numerous sintering techniques are known in the art, and the selection of a particular technique may depend upon the build material used, and the desired structural, functional or aesthetic result for the fabricated object. For example, in solid-state (non-activated) sintering, metal powder particles are heated to form connections (or "necks") where they are in contact. Over time, these necks thicken and create a dense part, leaving small, interstitial voids that can be closed, e.g., by hot isostatic pressing (HIP) or similar processes. Other techniques may also or instead be employed. For example, solid state activated sintering uses a film between powder particles to improve mobility of atoms between particles and accelerate the formation and thickening of necks. As another example, liquid phase sintering may be used, in which a liquid forms around metal particles. This can improve diffusion and joining between particles, but also may leave lower-melting phase within the sintered object that impairs structural integrity. Other advanced techniques such as nano-phase separation sintering may be used, for example to form a high-diffusivity solid at the necks to improve the transport of metal atoms at the contact point Debinding and sintering may result in material loss and compaction, and the resulting object may be significantly smaller than the printed object. However, these effects are generally linear in the aggregate, and net shape objects can be usefully scaled up when printing to create a corresponding shape after debinding and sintering.

Figure 8:
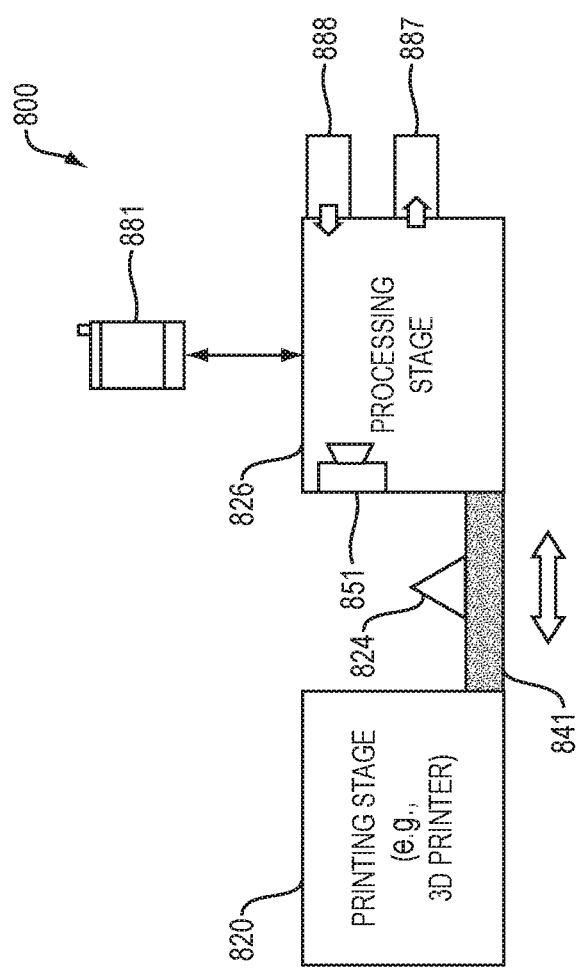
FIG. 8 is a block diagram of an example embodiment of an additive manufacturing system for use with metal injection molding materials.

FIG. 8 is a block diagram of an example embodiment of an additive manufacturing system for use with metal injection molding materials in which an example embodiment disclosed above may be implemented. The system 800 may include a printing stage 820, a conveyor 841, and a processing station (also referred to interchangeably herein as a processing stage) 826. In general, the printing stage 820 may be any of the printers disclosed above including, for example a fused filament fabrication system, a stereolithography system, a selective laser sintering system, or any other system that can be usefully adapted to form a net shape object under computer control using injection molding build materials. The output of the printing stage 820 may be an 3D object 824 that is a green body including any suitable powder (e.g., metal, metal alloy, ceramic, and so forth, as well as combinations of the foregoing), along with a binder that retains the powder in a net shape produced by the printing stage 820.

The conveyor 841 may be used to transport the 3D object 824 from the printing stage 820 to a processing stage 826 where debinding and sintering can be performed. The conveyor 841 may be any suitable device or combination of devices suitable for physically transporting the 3D object 824. This may, for example, include robotics and a machine vision system or the like on the printer side for detaching the 3D object 824 from a build platform or the like, as well as robotics and a machine vision system or the like on the processing side to accurately place the 3D object 824 within the processing stage 826. In another aspect, the processing stage 826 may serve multiple printers so that a number of objects can be debound and sintered concurrently, and the conveyor 841 may interconnect the printers and processing station so that multiple print jobs can be coordinated and automatically completed in parallel. In another aspect, the 3D object 824 may be manually transported between the two corresponding stations.

The processing stage 826 may be any system or combination of systems useful for converting a green part formed into a desired net shape from a metal injection molding build material by the printing stage 820 into a final object. The processing stage 826 may, for example, include a chemical debinding station and a thermal sintering station that can be used in sequence to produce a final object. Some contemporary injection molding materials are engineered for thermal debinding, which makes it possible to perform a combination of debinding and sintering steps with a single oven or similar device. While the thermal specifications of a sintering furnace may depend upon the powder to be sintered, the binder system, the loading, and other aspects of the green object and the materials used to manufacture same, commercial sintering furnaces for thermally debound and sintered MIM parts may typically operate with an accuracy of +/−5 degrees Celsius or better, and temperatures of at least 620 degrees C., or from about 700 degrees C. to about 1900 degrees C. for extended times. Any such furnace or similar heating device may be usefully employed as the processing stage 826 as disclosed herein. Vacuum or pressure treatment may also or instead be used. In an aspect, identical or similar material beads with a non-binding coating may be used for a furnace support—e.g., packing in a bed of this material that shrinks similar to the part, except that it will not bond to the part.

Embodiments may be implemented with a wide range of other debinding and sintering processes. For example, the binder may be removed in a chemical debind, thermal debind, or some combination of these. Other debinding processes are also known in the art (such as supercritical or catalytic debinding), any of which may also or instead be employed by the processing stage 826 as disclosed herein. For example, in a common process, a green part is first debound using a chemical debind, which is following by a thermal debind at a moderately high temperature (in this context, around 700-800 C) to remove organic binder and create enough necks among a powdered material to permit handling. From this stage, the object may be moved to a sintering furnace to remove any remaining components of a binder system densify the object. In another aspect, a pure thermal debind may be used to remove the organic binder. More general, any technique or combination of techniques may be usefully employed to debind an object as disclosed herein.

Similarly, a wide range of sintering techniques may be usefully employed by the processing station. In one aspect, an object may be consolidated in a furnace to a high theoretical density using vacuum sintering. In another aspect, the furnace may use a combination of flowing gas (e.g., at below atmosphere, slightly above atmosphere, or some other suitable pressure) and vacuum sintering. More generally, any sintering or other process suitable for improving object density may be used, preferably where the process yields a near-theoretical density part with little or no porosity. Hot-isostatic pressing ("HIP") may also (e.g., as a post-sinter finishing step) or instead be employed, e.g., by applying elevated temperatures and pressures of 10-50 ksi, or between about 15 and 30 ksi. In another aspect, the object may be processed using any of the foregoing, followed by a moderate overpressure (greater than the sintering pressure, but lower than HIP pressures). In this latter process, gas may be pressurized at 620-6510 psi and maintained at elevated temperatures within the furnace or some other supplemental chamber. In another aspect, the object may be separately heated in one furnace, and then immersed in a hot granular media inside a die, with pressure applied to the media so that it can be transmitted to the object to drive more rapid consolidation to near full density. More generally, any technique or combination of techniques suitable for removing binder systems and driving a powdered material toward consolidation and densification may be used by the processing stage 826 to process a fabricated green part as disclosed herein.

In one aspect, the processing stage 826 may be incorporated into the printing stage 820, thus removing a need for a conveyor 841 to physically transport the 3D object 824. The build volume of the printing stage 820 and components therein may be fabricated to withstand the elevated debinding/sintering temperatures. In another aspect, the printing stage 820 may provide movable walls, barriers, or other enclosure(s) within the build volume so that the debind/sinter can be performed while the 3D object 824 is on a build platform within the printing stage 820, but thermally isolated from any thermally sensitive components or materials.

The processing stage 826 may be optimized in a variety of ways for use in an office environment. In one aspect, the processing stage 826 may include an inert gas source 888. The inert gas source 888 may, for example, include argon or other inert gas (or other gas that is inert to the sintered material), and may be housed in a removable and replaceable cartridge that can be coupled to the processing stage 826 for discharge into the interior of the processing stage 826, and then removed and replaced when the contents are exhausted. The processing stage 826 may also or instead include a filter 810 such as a charcoal filter or the like for exhausting gasses that can be outgassed into an office environment in an unfiltered form. For other gasses, an exterior exhaust, or a gas container or the like may be provided to permit use in unventilated areas. For reclaimable materials, a closed system may also or instead be used, particularly where the environmental materials are expensive or dangerous.

In one aspect, the processing stage 826 may be coupled to other system components. For example, the processing stage 826 may include information from the printing stage 820, or from a controller for the printer, about the geometry, size, mass and other physical characteristics of the 3D object 824 in order to generate a suitable debinding and sintering profile. In another aspect, the profile may be independently created by the controller or other resource and transmitted to the processing stage 826 when the 3D object 824 is conveyed. In another aspect, the processing stage 826 may monitor the debinding and sintering process and provide feedback, e.g., to a smart phone or other remote device 887, about a status of the object, a time to completion, and other processing metrics and information. The processing stage 826 may include a camera 851 or other monitoring device to provide feedback to the remote device 887, and may provide time lapse animation or the like to graphically show sintering on a compressed time scale. Processing may also or instead include finishing with heat, a hot knife, tools, or similar, and may include applying a finish coat.

In one aspect, the processing stage 826 may employ microwave sintering to accelerate processing. Powdered metals in particular are very good absorbers of microwave energy and can be efficiently heated using microwave techniques. Ceramics can also be sintered in this manner, where microwave heating is linked to the dielectric loss of the material and other factors. Any other configuration suitable for microwave heating in an amount and for a duration suitable for sintering of MIM materials may also or instead be employed. Where the binder system of the build material is also engineered for thermal debinding, the method may include debinding the green object by applying microwave energy, e.g., using the processing stage 826 disclosed above.

Figure 9:
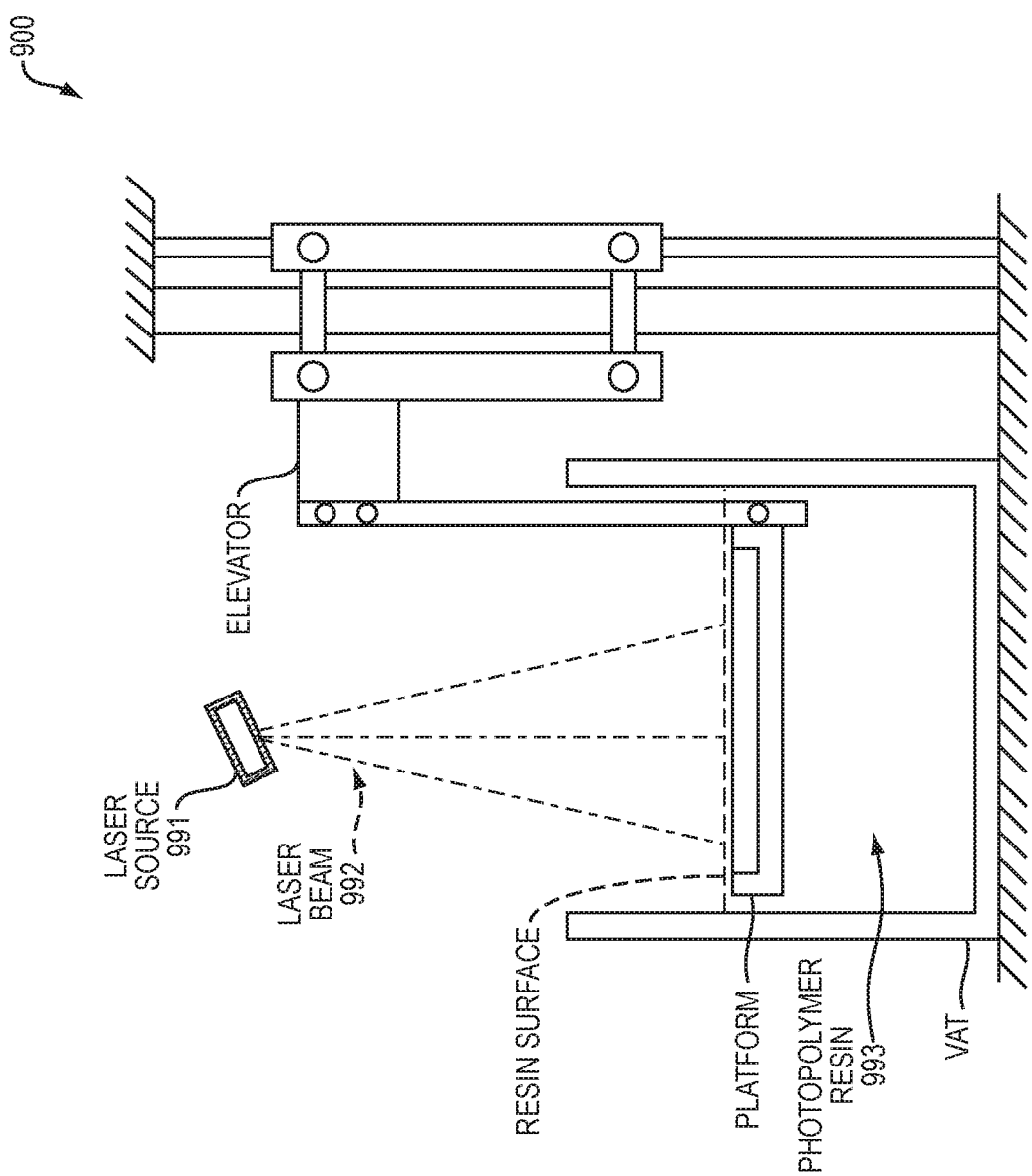
FIG. 9 is a block diagram of an example embodiment of a stereolithography process using a metallic powder and an ultraviolet-curable binder.

FIG. 9 is a block diagram 900 of an example embodiment of aa stereolithography process using a metallic powder and an ultraviolet-curable binder in which an example embodiment disclosed above may be implemented. In general, a build material may be formed using an injection molding powder, such as any of those disclosed herein, along with an ultraviolet-curable binder such as any suitable photopolymer resin 993 that can be cured using stereolithography. This build material may be cured on a layer-by-layer basis with a laser source 991 that may be an ultraviolet laser using known stereolithography techniques to form a UV-cured green body having a shape of the desired object. MIM powders may generally be opaque, and adaptations to the laser light source may be used to improve the structural integrity of the fabricated green object, such as using a layer size equal to or less than an average powder diameter, or providing laser light from multiple sources/directions in order to reduce or minimize occlusion of the UV resin at each layer. In another aspect, there is disclosed herein a sinterable, net shape green body object based formed according to a computer model and including a base material in powder form and an ultraviolet curable (or ultraviolet-cured) resin that can be debound and/or sintered into a final object, as well as a process for sintering an object comprising a base material in powder form and an ultraviolet-cured resin. The metallic powder may be suspended within an ultraviolet-curable binder, creating a slurry or suspension. The mass and surface area of the particles versus the specific rheology of the binder may dictate whether or not the powder will float indefinitely or settle due to gravity. Using nano sized particles may optimize the powders ability to form a stable suspension that does not settle (over reasonable timescales).

In order to reduce binder char and subsequent carbon contamination and increase shape retention, the binder may usefully be composed of two parts—a UV curable resin and a second component that may be removed (e.g., debound) prior to insertion into the furnace. Similar multicomponent binder formulations have been shown to reduce carbon pickup from the burnout process and reduce part failures by buildup of gases inside the part. Many possible binder combinations exist, including poly(ethylene glycol) (PEG) as a solvent-soluble component that may be removed prior to insertion into the furnace, along with a backbone based on poly(ethylene glycol) diacrylate (PEG-DA), or any number of other UV curable resins.

The ultraviolet-curable resin may, for example include a commercially available investment casting resin engineered for stereolithography fabrication, or any other suitable UV curable resin or the like. The UV curable resin may usefully incorporate an increased concentration of an activating die (at least 50% greater than typical commercially available UV curable resins) to compensate for optical interference of opaque particles.

In another aspect, the process may be modified to address particle opacity in other ways. For example, the current layer may be coated with polymer (e.g., by moving the object along the z-axis within a bath, either up or down according to the species of stereolithography being employed), and then a powder may be introduced, after which the layer may be cured in a desired cross section using UV exposure. In another aspect, the layer may be cured, powdered, and then coated with another layer of powder, so that the resin is fully exposed to the UV stimulus before coating with an additional powder layer.

In another aspect, the mixture of a MIM powder and a UV-curable resin may be dispensed and cured on the fly in order to remove or reduce the need for a resin holding tank. More generally, any technique for local thermal activation of a binder may be used in combination with a powder bed of MIM material (and binder) as disclosed herein to form a green body. For example, targeted thermal activation may be achieved with a thermal print head, an IR heating mask and/or lamp, focused microwave energy, selective thermal sintering, steering of an activation beam 992 with a digital light processing chip, a heated roller, or any other technique or combination of techniques.

Figure 10:
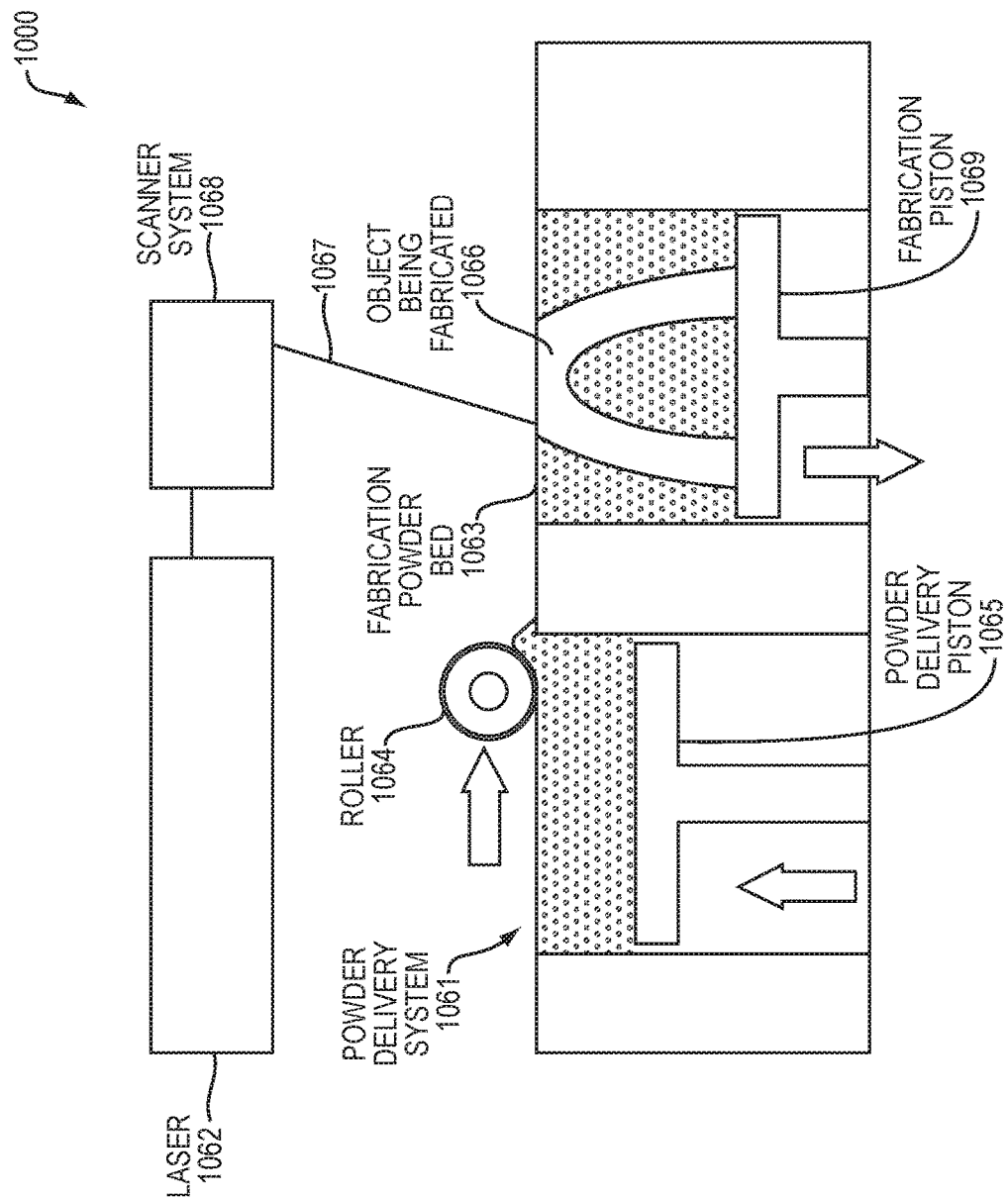
FIG. 10 is a block diagram of an example embodiment of a laser binding process for powder metallurgy materials.

FIG. 10 is a block diagram 1000 of an example embodiment of a laser binding process for powder metallurgy materials in which an example embodiment disclosed herein may be implemented. The laser binding process may serve as a printing stage or a combination of the printing stage with a processing stage. In a process comparable to selective laser sintering, a powder/binder mixture may be fed from a powder delivery system 1061 to a fabrication powder bed 1063 via a powder delivery piston 1065 and a roller 1064. The binder 1067 may be activated on a layer-by-layer basis using a laser 1062 or other activation source and/or a scanner system 1068 to create a low strength bond within the powder for each cross section of a target shape. This activation may form a sufficient bond to retain the powder and binder in a net shape green body, that is, an object being fabricated 1066 and supported by a fabrication piston 1069. The object being fabricated 1066 can be removed and sintered using the sintering processes disclosed herein. Suitable binders are available that can be activated using relatively inexpensive, low-power, fast laser processes or masked IR or UV. This significantly improves upon existing direct metal laser sintering processes that would otherwise require special atmospheric controls and high-power lasers.

Higher energy lasers may be usefully employed, for example, to more fully melt and/or remove binder material and improve the density of the green body before sintering, or to initiate sintering of the metal within the green body. In another aspect, the MIM materials disclosed herein may be adapted for use in a selective laser melting process where the binder melts, rather than sinters, to form a net-shape green body which is then debound and sintered according to the methods disclosed herein.

Figure 11:
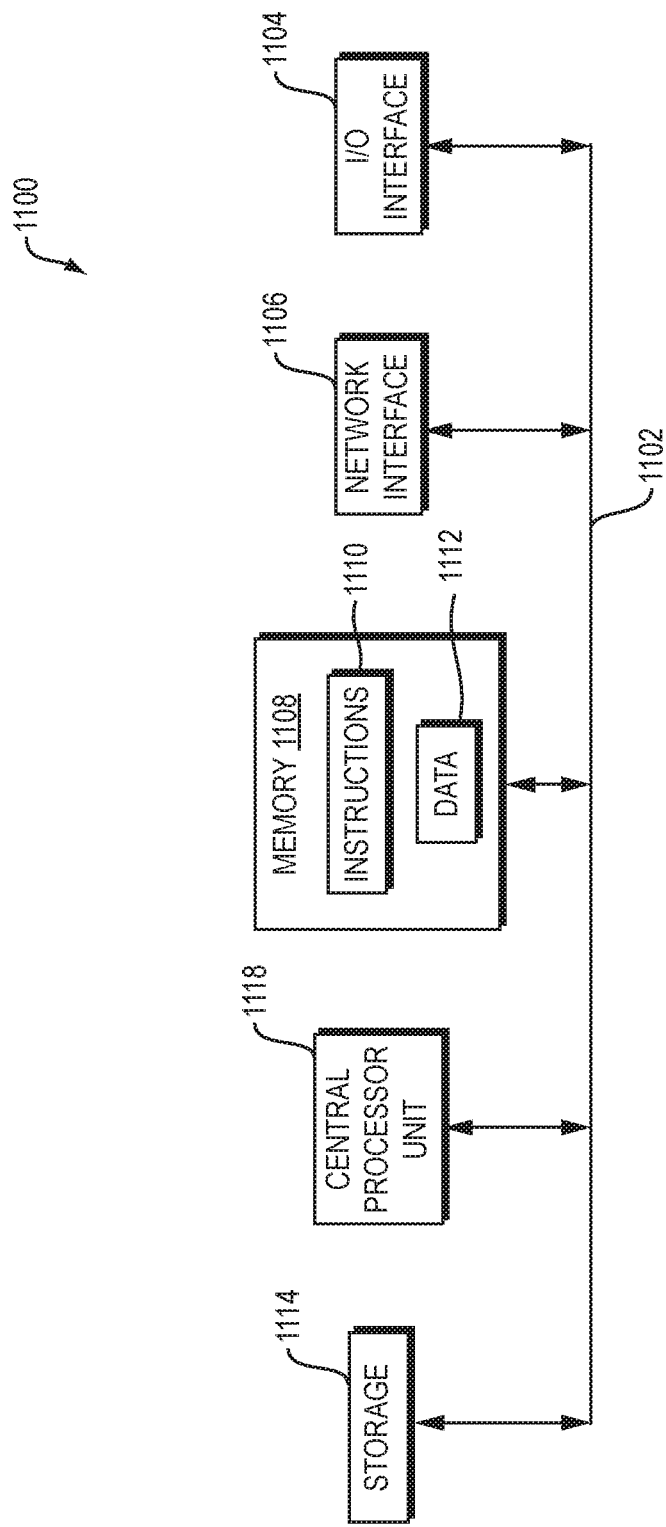
FIG. 11 is a block diagram of an example internal structure of a computer in which various embodiments of the present disclosure may be implemented.

FIG. 11 is a block diagram of an example of the internal structure of a computer 1100 in which various embodiments of the present disclosure may be implemented. The computer 1100 contains a system bus 1102, where a bus is a set of hardware lines used for data transfer among the components of a computer or processing system. The system bus 1102 is essentially a shared conduit that connects different elements of a computer system (e.g., processor, disk storage, memory, input/output ports, network ports, etc.) that enables the transfer of information between the elements. Coupled to the system bus 1102 is an I/O device interface 1104 for connecting various input and output devices (e.g., keyboard, mouse, displays, printers, speakers, etc.) to the computer 1100. A network interface 1106 allows the computer 1100 to connect to various other devices attached to a network. Memory 1108 provides volatile storage for computer software instructions 1110 and data 1112 that may be used to implement embodiments of the present disclosure. Disk storage 1114 provides non-volatile storage for computer software instructions 1110 and data 1112 that may be used to implement embodiments of the present disclosure. A central processor unit 1118 is also coupled to the system bus 1102 and provides for the execution of computer instructions.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods disclosed herein. It should be understood that elements of the block and flow diagrams may be implemented in software or hardware, such as via one or more arrangements of circuitry, disclosed above, or equivalents thereof, firmware, a combination thereof, or other similar implementation determined in the future. In addition, the elements of the block and flow diagrams disclosed herein may be combined or divided in any manner in software, hardware, or firmware. If implemented in software, the software may be written in any language that can support the example embodiments disclosed herein. The software may be stored in any form of computer readable medium, such as random access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein. Further, example embodiments and elements thereof may be combined in a manner not explicitly disclosed herein.

While example embodiments have been particularly shown and described, it will be understood by those skilled in the art that various changes in form and details may be made therein without departing from the scope of the embodiments encompassed by the appended claims.

What is claimed is:

1. A printer system configured to print a three-dimensional (3D) metal object, the system comprising:
a carrier configured to dispense a build material;
a build plate configured to receive the build material from the carrier during printing;
an obtaining device configured to measure a physical property of a printed object;
a memory having one or more physical properties of a target object and one or more design rules for forming the printed object stored thereon;
a debinding subsystem configured to remove a binder from the build material of the printed object; and
a controller operably coupled to the obtaining device, wherein the controller is configured to compare the measured physical property to the one or more physical properties of the target object and to modify the one or more design rules based on the comparison, and wherein the controller is configured to modify the one or more design rules by changing a chemical employed in the debinding subsystem or a temperature of the chemical employed in the debinding subsystem.

2. The system according to claim 1, wherein the measured physical property is a mass of the printed object, and changing the chemical employed in the debinding subsystem or changing the temperature of the chemical employed in the debinding subsystem is configured to change an amount of the binder to be removed from the build material such that the mass of the printed object is changed.

3. The system according to claim 1,
wherein the controller is further configured to modify the one or more design rules by changing an extrusion parameter of the carrier to dispense the build material at a different rate.

4. The system according to claim 3, wherein the measured physical property is a mass of the printed object, and dispensing the build material at the different rate is configured to change a target mass of the target object.

5. The system according to claim 1, further comprising:
a furnace subsystem configured to heat the printed object, wherein the controller is further configured to modify the one or more design rules by changing one or more of a heating time of the printed object by the furnace subsystem, a heating temperature of the printed object by the furnace subsystem, a temperature heating rate of the printed object by the furnace subsystem, or a temperature cooling rate of a chamber of the furnace subsystem.

6. The system according to claim 1, wherein the controller is further configured to modify the one or more design rules by changing a deconstruction of the target object, and wherein the deconstruction of the target object includes one or more toolpath commands for printing the object.

7. The system according to claim 6, wherein the deconstruction of the target object includes separation of the target object into a plurality of layers, and wherein each of the plurality of layers corresponds to a layer of the printed object.

8. The system according to claim 1, wherein the controller is further configured to modify the one or more design rules by scaling one or more dimensions of the target object if the comparison indicates a discrepancy between the measured physical property and the one or more physical properties of the target object.

9. The system according to claim 1, wherein the controller is configured to modify the one or more design rules by adding a support structure to the target object based on the comparison.

10. The system according to claim 1, wherein the controller is further configured to modify the one or more design rules by modifying a dimension of the target object based on a type of the build material the carrier is configured to dispense during printing.

11. The system according to claim 1, wherein the obtaining device is a coordinate measuring machine.

12. A printer system configured to print a three-dimensional (3D) metal object, the system comprising:
a carrier configured to dispense a build material to form a printed object;
a build surface configured to receive the build material from the carrier during printing;
at least one of a laser scanner or a non-contact measuring device configured to measure at least one characteristic of the printed object;
a memory having one or more design rules for forming the printed object stored thereon; and
a controller operably coupled to the carrier and to the at least one of the laser scanner or the non-contact measuring device, wherein the controller is configured to control the carrier to dispense the build material based on the one or more design rules, and wherein the controller is configured to receive the at least one measured characteristic of the printed object from the at least one of the laser scanner or the non-contact measuring device,
wherein the one or more design rules include instructions for determining a type of the build material, and wherein the controller is configured to modify the one or more design rules by modifying a dimension of the target object based on the type of the build material.

13. The system according to claim 12, wherein the controller is further configured to modify the one or more design rules based on the at least one measured characteristic received from the at least one of the laser scanner or the non-contact measuring device.

14. The system according to claim 12, wherein the one or more design rules further include instructions for forming the printed object to have at least one dimension greater than an intended dimension of a post-processed version of the printed object.

15. The system according to claim 12, further comprising:
a debinding subsystem configured to remove a binder from the build material of the printed object, wherein the controller is configured to modify the one or more design rules by changing an extrusion parameter of the carrier to dispense the build material at a different rate.

16. The system according to claim 12, wherein the controller is further configured to modify the one or more design rules by changing a deconstruction of the target object, wherein the deconstruction of the target object includes toolpath commands, and wherein the controller is configured to control the carrier to dispense the build material based on the toolpath commands.

17. The system according to claim 16, wherein the deconstruction of the target object includes the target object separated into a plurality of layers, and wherein each of the plurality of layers corresponds to a layer of the printed object.

18. A method for printing a three-dimensional metal object using additive manufacturing, the method comprising:
dispensing a build material from a carrier onto a build surface to form a printed object based on one or more design rules for printing the object;
measuring one or more physical properties of the printed object using at least one of a contact or a non-contact measuring device;
comparing the one or more measured physical properties to one or more physical properties of a target object; and
modifying the one or more design rules based on the comparison, wherein modifying the one or more design rules includes:
determining whether to add a support structure to the target object based on the comparing, and
modifying the target object to include the support structure once the support structure is determined to be added to the target object.

19. The method according to claim 18, further comprising:
removing a binder from the build material of the printed object using a debinding subsystem, wherein modifying the one or more design rules includes changing a chemical employed in the debinding subsystem or changing a temperature of the chemical employed in the debinding subsystem.

20. The method according to claim 19, wherein the measured one or more physical properties is a mass of the printed object, and wherein changing the chemical employed in the debinding subsystem or changing the temperature of the chemical employed in the debinding subsystem includes changing an amount of the binder to be removed from the build material such that the mass of the printed object is changed.

21. The method according to claim 18, further comprising:
removing a binder from the build material of the printed object using a debinding subsystem, wherein modifying the one or more design rules includes changing an extrusion parameter of the carrier to dispense the build material at a different rate.

22. The method according to claim 21, further comprising:
heating the printed object using a furnace subsystem, wherein modifying the one or more design rules includes changing one or more of a heating time of the printed object by the furnace subsystem, a heating temperature of the printed object by the furnace subsystem, a temperature heating rate of the printed object by the furnace subsystem, or a temperature cooling rate of a chamber of the furnace subsystem.

23. The method according to claim 18, wherein the method further comprises deconstructing the target object, wherein modifying the one or more design rules includes modifying a deconstruction of the target object, and wherein modifying the one or more design rules includes generating a toolpath command for printing a subsequent object based on the modified deconstruction of the target object.

24. The method according to claim 23, wherein deconstructing the target object includes separating the target object into a plurality of layers, each of the plurality of layers corresponding to a layer of the printed object.

25. The method according to claim 18, wherein comparing the one or more measured physical properties to the one or more physical properties of the target object includes determining a discrepancy between the one or more physical properties of the target object and the one or more measured physical properties of the printed object, and wherein modifying the one or more design rules includes scaling one or more dimensions of the target object based on the discrepancy.

26. The method according to claim 18, wherein modifying the one or more design rules includes:
determining a type of the build material; and
modifying a dimension of the target object based on the type of the build material.

* * * * *